United States Patent
Su et al.

(10) Patent No.: US 9,841,281 B2
(45) Date of Patent: Dec. 12, 2017

(54) MICRO-ELECTROMECHANICAL APPARATUS UTILIZING FOLDED SPRING FOR ROTARY ELEMENT

(71) Applicant: INDUSTRIAL TECHNOLOGY RESEARCH INSTITUTE, Hsinchu (TW)

(72) Inventors: Chung-Yuan Su, Taichung (TW); Chun-Yin Tsai, Kaohsiung (TW); Chao-Ta Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 233 days.

(21) Appl. No.: 14/553,595

(22) Filed: Nov. 25, 2014

(65) Prior Publication Data
US 2015/0260517 A1 Sep. 17, 2015

(30) Foreign Application Priority Data
Mar. 14, 2014 (TW) .............................. 103109751 A

(51) Int. Cl.
*B81B 3/00* (2006.01)
*G01C 19/5762* (2012.01)

(52) U.S. Cl.
CPC ........ *G01C 19/5762* (2013.01); *B81B 3/0045* (2013.01); *B81B 2201/0235* (2013.01);
(Continued)

(58) Field of Classification Search
CPC ................ B81B 2201/0235; B81B 2203/0163
(Continued)

(56) References Cited

U.S. PATENT DOCUMENTS 6,392,220 B1 * 5/2002 Slater .................... B81B 3/0051
250/216
6,744,174 B2 6/2004 Paden et al.
(Continued)

FOREIGN PATENT DOCUMENTS

CN 103226017 A 7/2013
TW 201018948 A 5/2010
(Continued)

OTHER PUBLICATIONS

Yanhui Bai et al., A 2-D Micromachined SOI MEMS Mirror With Sidewall Electrodes for Biomedical Imaging, IEEE/ASME Transactions on Mechatronics, 2010, 501-510, vol. 15, No. 4.
(Continued)

*Primary Examiner* — John Chapman, Jr.
(74) *Attorney, Agent, or Firm* — Maschoff Brennan

(57) ABSTRACT

A micro-electromechanical apparatus includes a rotary element, at least one restraint and at least two folded springs. The rotary element is capable of rotating with respect to an axis. The folded springs are symmetrically disposed about the axis. Each folded spring has a moving end and a fixed end, the moving end is connected to the rotary element, and the fixed end is connected to the at least one restraint. The moving end is not located on the axis, and the fixed end is not located on the axis. A moving distance is defined as a distance between the moving end and the axis, a fixed distance is defined as a distance between the fixed end and the axis. A spring length is defined as a distance between the moving end and the fixed end. The spring length is varied according to the rotation of the rotary element.

39 Claims, 14 Drawing Sheets

(52) U.S. Cl.
CPC ............... *B81B 2201/0242* (2013.01); *B81B 2203/0163* (2013.01); *Y10T 74/12* (2015.01)

(58) Field of Classification Search
USPC ...................................................... 73/514.38
See application file for complete search history.

(56) References Cited

U.S. PATENT DOCUMENTS

| | | | |
|---|---|---|---|
| 7,355,774 B2* | 4/2008 | Kato | G02B 26/0833 359/224.1 |
| 7,652,547 B1 | 1/2010 | Wittwer et al. | |
| 7,951,635 B2 | 5/2011 | Klose et al. | |
| 8,334,736 B2 | 12/2012 | Kaajakari | |
| 8,429,970 B2 | 4/2013 | Rocchi | |
| 8,564,075 B1 | 10/2013 | Koury, Jr. | |
| 2005/0005698 A1 | 1/2005 | McNeil et al. | |
| 2008/0115579 A1 | 5/2008 | Seeger et al. | |
| 2010/0296146 A1 | 11/2010 | Krastev et al. | |
| 2012/0096943 A1 | 4/2012 | Potasek et al. | |
| 2012/0125101 A1 | 5/2012 | Seeger et al. | |
| 2012/0186346 A1* | 7/2012 | McNeil | G01P 15/125 73/514.32 |
| 2012/0228727 A1 | 9/2012 | Chen et al. | |
| 2013/0111990 A1 | 5/2013 | Wang et al. | |
| 2013/0271807 A1 | 10/2013 | Nitsche et al. | |
| 2013/0301102 A1 | 11/2013 | Kamiya et al. | |
| 2014/0292323 A1* | 10/2014 | Farghaly | G01R 33/0286 324/259 |

FOREIGN PATENT DOCUMENTS

| | | |
|---|---|---|
| TW | 201037772 A | 10/2010 |
| TW | 201040534 A | 11/2010 |
| WO | 2013055210 A1 | 4/2013 |

OTHER PUBLICATIONS

Jinghui Xu et al., A process-induced-frequency-drift resilient 32 kHz MEMS resonator, Journal of Micromechanics and Microengineering, 2012, 1-7.

Giuseppe Barillaro et al., Analysis, simulation and relative performances of two kinds of serpentine springs, Journal of Micromechanics and Microengineering, 2005, 736-746.

Yun-Ho Jang et al., Design of etch holes to compensate spring width loss for reliable resonant frequencies, Journal of Micromechanics and Microengineering, 2012, 1-6.

Rong Liu et al., MEMS resonators that are robust to process-induced feature width variations, Journal of Microelectromechanical Systems, 2002, 505-511, vol. 11, No. 5.

State Intellectual Property Office of the P. R. C, "Office Action", dated Apr. 13, 2016, China.

* cited by examiner ( First type : df < dm & ds < dm )

( Second type : df < dm & ds > dm )

(Third type : df = dm)

(Fourth type : df > dm & ds < df)

( Fifth type : df > dm & ds > df )

MICRO-ELECTROMECHANICAL APPARATUS UTILIZING FOLDED SPRING FOR ROTARY ELEMENT

CROSS-REFERENCE TO RELATED APPLICATIONS

This non-provisional application claims priority under 35 U.S.C. §119(a) on Patent Application No(s). 103109751 filed in Taiwan, R.O.C. on Mar. 14, 2014, the entire contents of which are hereby incorporated by reference.

TECHNICAL FIELD

The disclosure relates to a micro-electromechanical apparatus utilizing a folded spring for a rotation element.

BACKGROUND

In recent years, electronic consumers products, such as smart phones, tablet computers and video game consoles, often include micro-electromechanical systems sensors (MEMS sensors, e.g., MEMS accelerometer and MEMS gyroscope), and therefore the market for the MEMS sensors has significantly increased. As the technology and products of the MEMS accelerometer has been relatively maturing, the MEMS gyroscope is becoming a promising product in the market. For example, the MEMS gyroscope can be used in the smart phones with the functions of interactive game and navigation.

MEMS sensors such as MEMS gyroscope and comprises a rotary element, a torsion beam, a frame, folded springs and an anchors. The rotary element is connected to the frame via the torsion beam. The frame is connected to the anchor by the folded springs. Moreover, X axis can be defined as the perpendicular direction of extension of the torsion beam, and Y axis can be defined as the parallel direction of extension of the torsion beam. The principle of the MEMS gyroscope is described as follows. When the frame oscillates along the X axis, the rotary element oscillates along the X axis accordingly; when an angular velocity is generated along the Y axis, the rotary element may take the torsion beam as an axis of rotation to rotate repeatedly. At the same time, the capacitance between the rotary element of the MEMS gyroscope and electrode on the substrate is changed, so the angular velocity can be calculated.

As for an ideal design, the resonant frequency of the rotary element and that of the frame need to be identical. It can improve the sensitivity and accuracy of the MEMS gyroscope. However, the stiffness of the torsion beam of the MEMS gyroscope is directly proportional to the width of the torsion beam, but the stiffness of the folded spring is directly proportional to the cube of the width of the folded spring. Thus, when the torsion beam and the folded spring are manufactured with the same variation, the offset of the resonant frequency of the frame is larger than that of the rotary element. As a result, under the circumstances that the torsion beam and the folded spring are manufactured with the same variation, the rotary element and the frame may have resonant frequencies with difference during vibration. Furthermore, the greatest amplitude may not be obtained when the rotary element detects the angular velocity. Therefore, the sensitivity of the MEMS gyroscope are lowered.

In addition, the micro-electromechanical apparatus including a rotatable mass (i.e., rotary element), such as MEMS multi-axes accelerometer, MEMS magnetometer and MEMS micro mirror system, usually comprises a torsion beam which is connected to the rotary element to make the rotary element to rotate. When the dimension of these micro-electromechanical apparatus is miniaturized, the torsion beam is lengthened to make the rotary element rotate at specific frequency. Thus, the dimension of the micro-electromechanical apparatus including the rotary element may not be miniaturized while the torsion beams are used.

SUMMARY

One embodiment of the disclosure provides a micro-electromechanical apparatus comprising a rotary element, at least one restraint and at least two folded springs. The rotary element is capable of rotating with respect to an axis. The at least two folded springs are disposed symmetrically about the axis. Each folded spring has a moving end and a fixed end, the moving end is connected to the rotary element, and the fixed end is connected to the at least one restraint. The moving end is not located on the axis and the fixed end is not located on the axis. A moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element.

One embodiment of the disclosure provides a micro-electromechanical apparatus comprising a rotary element, at least one restraint and at least two folded springs. The rotary element is capable of rotating with respect to an axis. The at least two folded springs are disposed symmetrically about the axis. Each folded spring has a moving end and a fixed end, the moving end is connected to the rotary element, the fixed end is connected to the at least one restraint. The moving end is not located on the axis, and the fixed end is not located on the axis. A moving distance is defined as a distance between the moving end and the axis, a fixed distance is defined as a distance between the fixed end and the axis, a spring length is defined as a distance between the moving end and a reference point of the fixed end. The spring length is varied according to rotation of the rotary element. Each of the folded springs includes a plurality of spans that are connected in sequence, direction of extension of the plurality of the spans is parallel to direction of the axis, the at least one restraint is at least one suspension, and a width of the suspension is greater than a width of at least one of the plurality of the spans.

One embodiment of the disclosure provides a micro-electromechanical apparatus, comprising a rotary element, at least one restraint and at least two folded springs. The rotary element is capable of rotating with respect to an axis. The at least two folded springs are disposed symmetrically about the axis. Each folded spring has a moving end and a fixed end, the moving end is connected to the rotary element, and the fixed end is connected to the at least one restraint. The moving end is not located on the axis, and the fixed end is not located on the axis. A moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element. Each of the folded springs includes a plurality of spans that are connected in sequence, direction of extension of the plurality of the spans is parallel to direction of the axis, and lengths of at least two of the plurality of the spans are different from each other.

One embodiment of the disclosure provides a micro-electromechanical apparatus, being adapted to measure an angular velocity, comprising a mass, at least one restraint and a plurality of folded springs. The mass is capable of rotating with respect to an axis. The plurality of folded springs is disposed symmetrically about the axis. Each folded spring has a moving end and a fixed end. The moving end is connected to the mass, and the fixed end is connected to the at least one restraint. The moving end is not located on the axis, and the fixed end is not located on the axis. A moving distance is defined as a distance between the moving end and the axis, a fixed distance is defined as a distance between the fixed end and the axis, a spring length is defined as a distance between the moving end and a reference point of the fixed end. The spring length is varied according to rotation of the mass. The fixed distance is less than or equal to the moving distance, and the spring length is less than or equal to the moving distance.

BRIEF DESCRIPTION OF THE DRAWINGS

The disclosure will become more fully understood from the detailed description given hereinbelow and the accompanying drawings which are given by way of illustration only and thus are not limitative of the disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
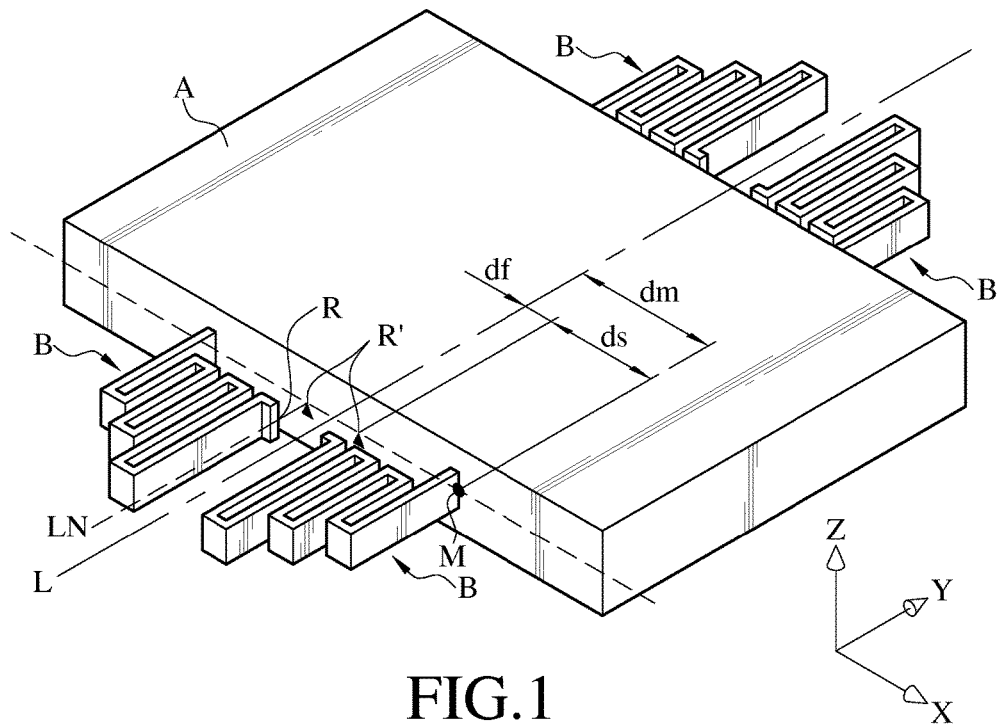
FIG. 1 is a partially perspective view of a micro-electromechanical apparatus according to an embodiment of the disclosure.
Figure 2:
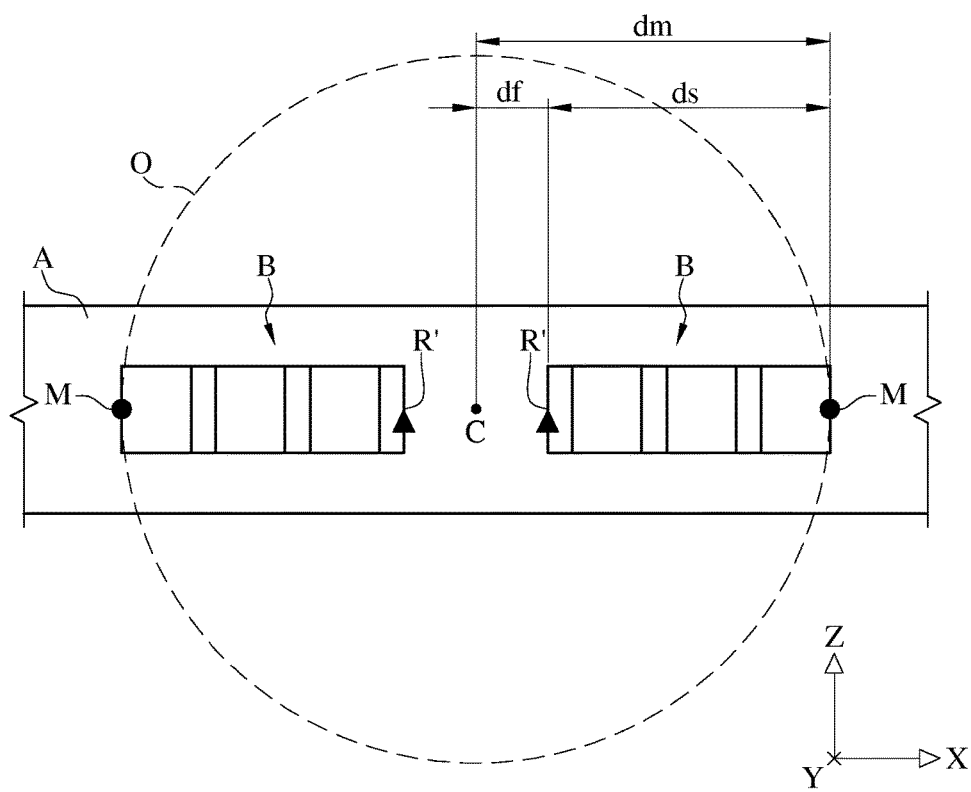
FIG. 2 is a side view of the micro-electromechanical apparatus in FIG. 1.

Please refer to FIGS. 1 and 2, FIG. 1 is a partially perspective view of a micro-electromechanical apparatus according to an embodiment of the disclosure, and FIG. 2 is a side view of the micro-electromechanical apparatus in FIG. 1. A rotary element A of a micro-electromechanical apparatus is capable of rotating with respect to an axis L. A folded spring B (namely, serpentine spring) has a moving end M and a fixed end R. The folded spring B is connected to the rotary element A at the moving end M and is connected to a restraint (not shown) at the fixed end R. When the rotary element A rotates with respect to the axis L, the moving end M rotates along a circle O (dotted lines shown in FIG. 2). The axis L intersects the plane of the circle O at a center C. In order to define specific distances which are used to describe the movement principle of micro-electromechanical apparatus in this disclosure, a reference point R' of the fixed end R can be defined as the intersect of the plane of the circle O and line LN which is parallel to the axis L and passes through the fixed end R. Consequently, the moving end M, the reference point R' of the fixed end R and center C are on the plane of the circle O.

As shown in FIG. 1 and FIG. 2, a moving distance dm is defined as a distance between the moving end M and the axis L or is defined as a distance between the moving end M and the center C. A fixed distance df is defined as a distance between the fixed end R and the axis L or is defined as a distance between the reference point R' and the center C. The spring length ds is defined as a distance between the moving end M and the reference point R' of the fixed end R.

Neither the moving end nor the fixed end of the micro-electromechanical apparatus of the disclosure is located on the axis, and therefore several types of micro-electromechanical apparatuses are derived. The following describes different types of the micro-electromechanical apparatus and the movements thereof.

Figure 3:
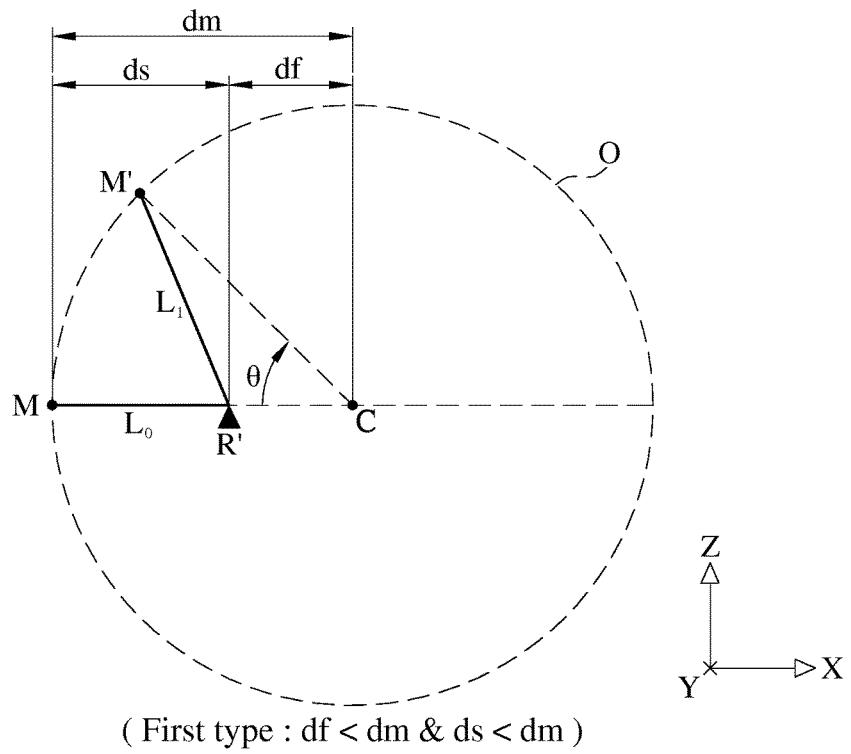
FIG. 3 is a view of a movement principle of a first type of a micro-electromechanical apparatus according to an embodiment of the disclosure.

Please refer to FIG. 3, which is a view of a movement principle of a first type of a micro-electromechanical apparatus according to an embodiment of the disclosure. According to the first type movement principle, the reference point R' of the fixed end R of the folded spring B is located within the circle O, and the spring length ds is less than the radius of the circle O. In other words, the fixed distance df is less than the moving distance dm, and the spring length ds is less than the moving distance dm. When the rotary element A rotates by an angle θ, the moving end M of the folded spring B may rotate from a point M to a point M' about the center C. At this moment, the length between the moving end M and the reference point R' of the fixed end R of the folded spring B is increased from length L0 (i.e., the distance between the point M and the point R') to length L1 (i.e., the distance between the point M' and the point R'), which means the length L1 is greater than the length L0. From the above-mentioned description and the geometrical relation in FIG. 3, the first type movement principle of the micro-electromechanical apparatus satisfies the following relation:

(1) The fixed distance is less than the moving distance (df<dm); and
(2) The spring length is less than the moving distance (ds<dm).

Figure 4:
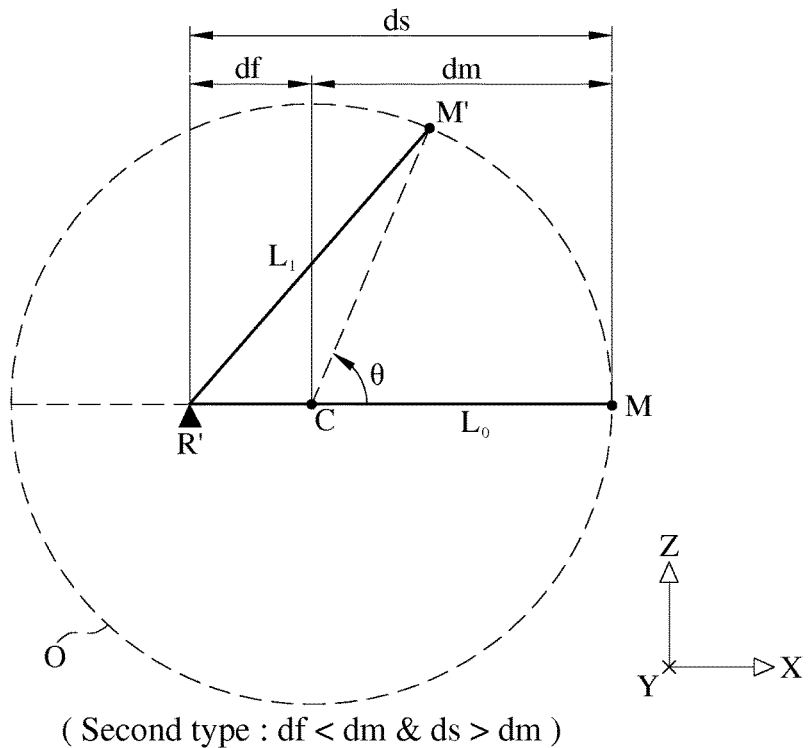
FIG. 4 is a view of a movement principle of a second type of a micro-electromechanical apparatus according to an embodiment of the disclosure.

Please refer to FIG. 4, which is a view of a movement principle of a second type of a micro-electromechanical apparatus according to an embodiment of the disclosure. According to the second type movement principle, the reference point R' of the fixed end R of the folded spring B is located within the circle O, and the spring length ds is greater than the radius of the circle. In other words, the fixed distance df is less than the moving distance dm, and the spring length ds is greater than the moving distance dm. When the rotary element A rotates by an angle θ, the moving end M of the folded spring B rotates from the point M to the point M' about the center C. At this moment, the length between the moving end M and the reference point R' of the fixed end R of the folded spring B is decreased from length L0 (i.e., the distance between the point M and the point R') to length L1 (i.e., the distance between the point M' and the point R'), which means the length L1 is less than the length L0. From the above-mentioned description and the geometrical relation in FIG. 4, the second movement principle of the micro-electromechanical apparatus satisfies the following relation:

(1) the fixed distance is less than the moving distance (df<dm); and
(2) the spring length is greater than the moving distance (ds>dm).

Figure 5:
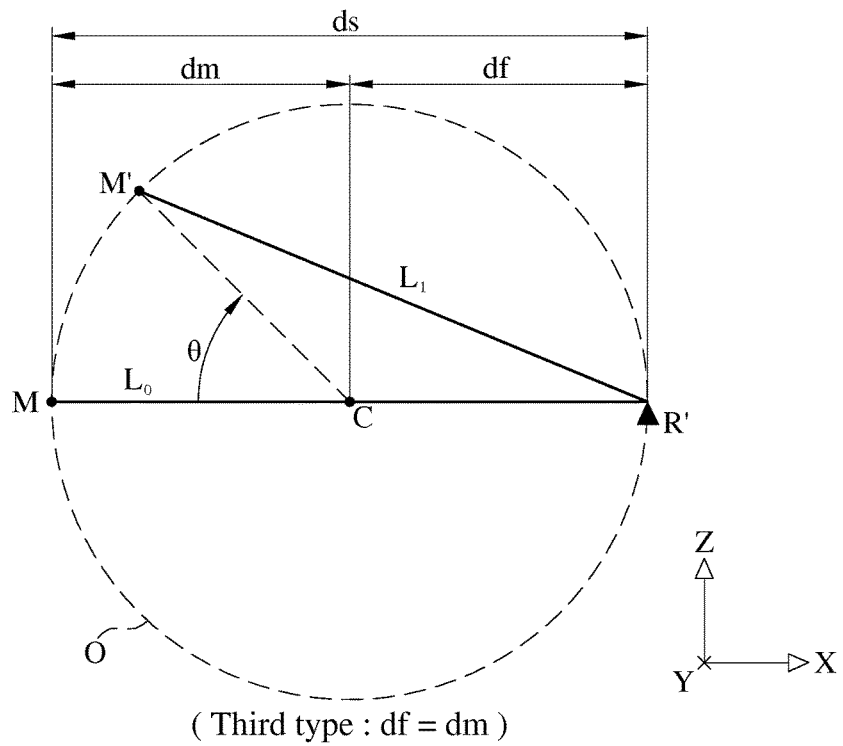
FIG. 5 is a view of a movement principle of a third type of a micro-electromechanical apparatus according to an embodiment of the disclosure.

Please refer to FIG. 5, which is a view of a movement principle of a third type of a micro-electromechanical apparatus according to an embodiment of the disclosure. According to the third type movement principle, the reference point R' of the fixed end R of the folded spring B is located on the circle O. In other words, the fixed distance df is equal to the moving distance dm. When the rotary element A rotates by an angle θ, the moving end M of the folded spring B rotates from the point M to the point M' about the center C. At this moment, the length between the moving end M and the reference point R' of the fixed end R of the folded spring B is decreased from length L0 (i.e., the distance between the point M and the point R') to length L1 (i.e., the distance between the point M' and the point R'), which means the length L1 is less than the length L0. From the above-mentioned description and the geometrical relation in FIG. 5, the third type movement principle of the micro-electromechanical apparatus satisfies the following relation:

(1) The fixed distance is equal to the moving distance (df=dm).

Figure 6:
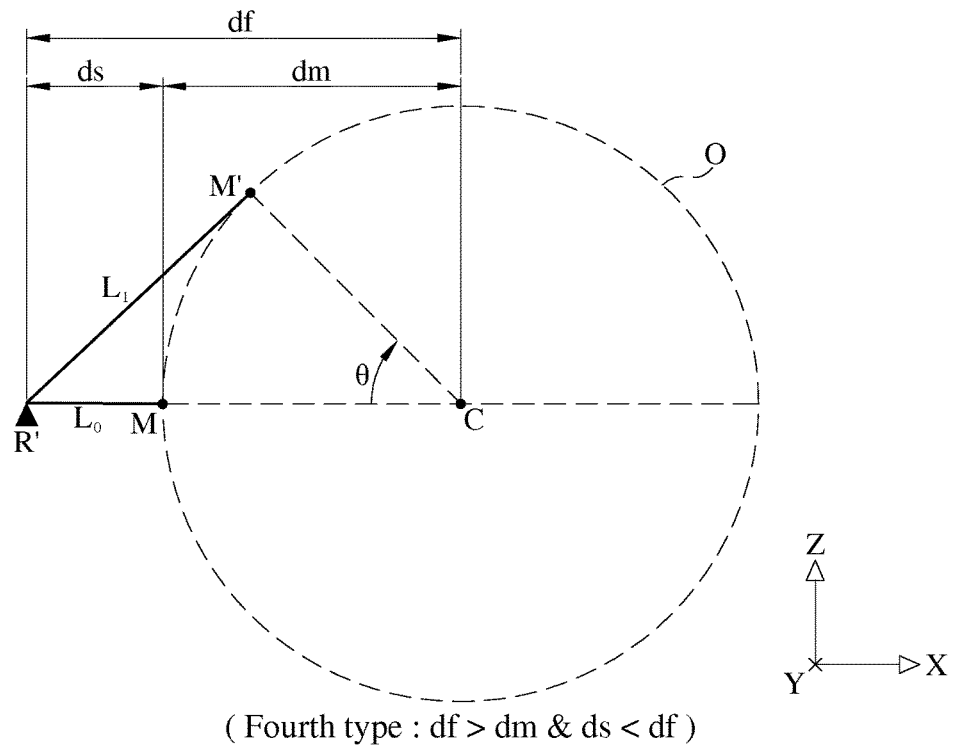
FIG. 6 is a view of a movement principle of a fourth type of a micro-electromechanical apparatus according to an embodiment of the disclosure.

Please refer to FIG. 6, which is a view of a movement principle of a fourth type of a micro-electromechanical apparatus according to an embodiment of the disclosure. According to the fourth type movement principle, the reference point R' of the fixed end R of the folded spring B is outside the circle O (i.e., the fixed distance df is greater than the moving distance dm), and the spring length ds is less than the fixed distance df. When the rotary element A rotates by an angle θ, the moving end M of the folded spring B rotates from the point M to the point M' about the center C. At this moment, the length between the moving end M and the reference point R' of the fixed end R of the folded spring B is increased from length L0 (i.e., the distance between the point M and the point R') to length L1 (i.e., the distance between the point M' and the point R'), which means the length L1 is greater than the length L0. From the above-mentioned description and the geometrical relation in FIG. 6, the forth movement principle of the micro-electromechanical apparatus satisfies the following relation:

(1) The fixed distance is greater than the moving distance (df>dm).
(2) The spring length is less than the fixed distance (ds<df).

Figure 7:
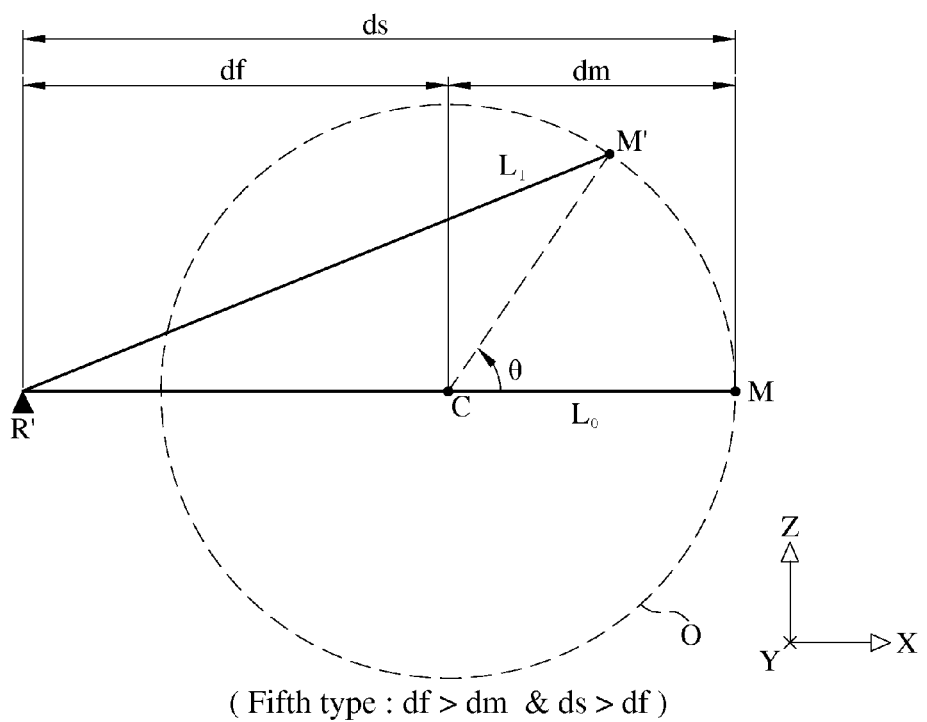
FIG. 7 is a view of a movement principle of a fifth type of a micro-electromechanical apparatus according to an embodiment of the disclosure.

Please refer to FIG. 7, which is a view of a movement principle of a fifth type of a micro-electromechanical apparatus according to an embodiment of the disclosure. According to the fifth type movement principle, the reference point R' of the fixed end R of the folded spring B is located outside the rotating circle O (i.e., the fixed distance df is greater than the moving distance dm), and the spring length ds is greater than the fixed distance df. When the rotary element A rotates by an angle θ, the moving end M of the folded spring B rotates from the point M to the point M' about the center C. At this moment, the length between the moving end M and the reference point R' of the fixed end R of the folded spring B is decreased from length L0 (i.e., the distance between the point M and the point R') to length L1 (i.e., the distance between the point M' and the point R'), which means the length L1 is less than the length L0. From the above-mentioned description and the geometrical relation in FIG. 7, the fifth type movement principle of the micro-electromechanical apparatus satisfies the following relation:

(1) The fixed distance is greater than the moving distance (df>dm); and
(2) The spring length is greater than the fixed distance (ds>df).

Figure 8A:
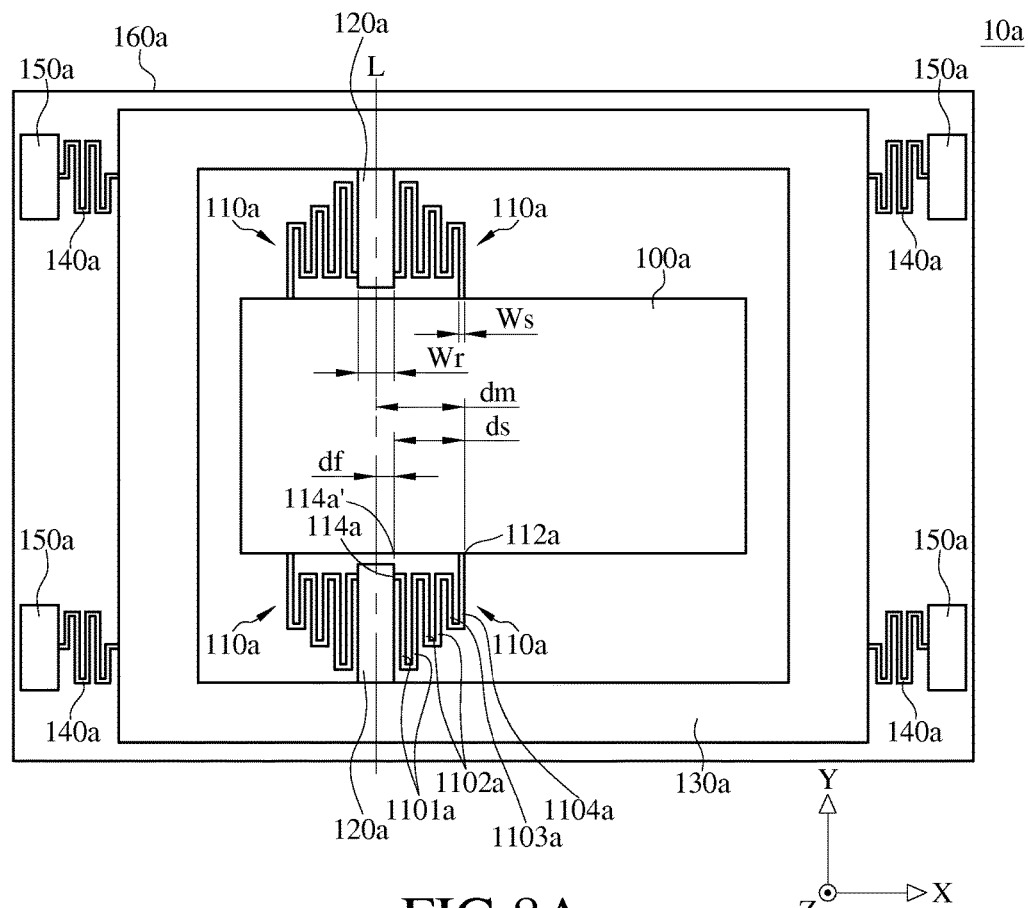
FIG. 8A is a top view of a micro-electromechanical apparatus according to an embodiment of the disclosure.
Figure 8B:
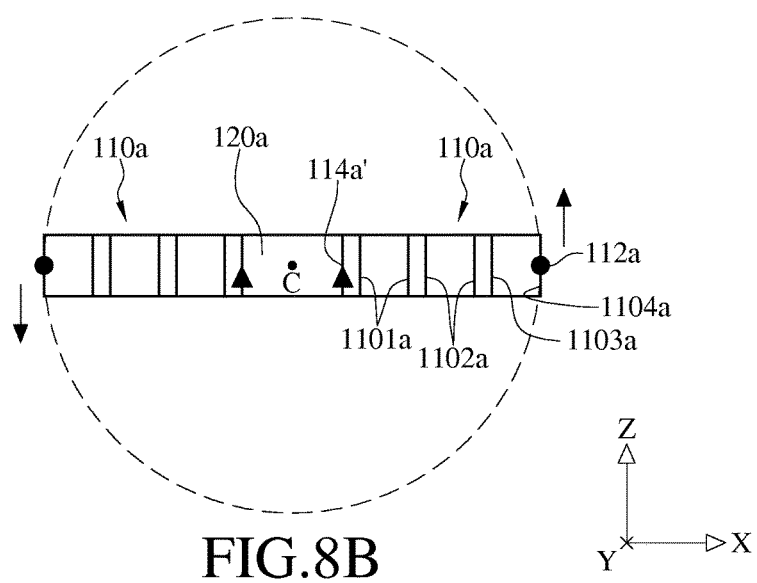
FIG. 8B is a partially side view of a micro-electromechanical apparatus according to an embodiment of the disclosure.

The following describes several embodiments of the disclosure. Please refer to FIGS. 8A and 8B. FIG. 8A is a top view of a micro-electromechanical apparatus according to an embodiment of the disclosure, and FIG. 8B is a partially side view of a micro-electromechanical apparatus according to an embodiment of the disclosure. In this disclosure, the micro-electromechanical apparatus 10*a* is used in, for example, a Y-axis gyroscope adapted to sense an angular velocity in the Y axis. The micro-electromechanical apparatus 10*a* comprises a rotary element 100*a* (i.e., a mass in this embodiment), at least one restraint (i.e., a suspension 120*a* in this embodiment), a plurality of folded springs 110*a*, an oscillation element (i.e., a frame 130*a* in this embodiment), a plurality of springs 140*a* and a plurality of anchors 150*a*.

The rotary element 100a is capable of rotating about an axis L. The number of the suspensions 120a is two in this embodiment, and the two suspensions 120a are disposed at two opposite sides of the rotary element 100a, and each of the suspensions 120a are connected to the frame 130a.

In this embodiment, the number of the folded springs 110a is four, which is exemplary. The folded springs 110a are divided into a plurality of groups, and each group has two folded springs 110a that are symmetrically disposed about the axis L. The folded springs 110a in this embodiment are in a line-symmetry arrangement with respect to the axis L. Each folded spring 110a has a moving end 112a and a fixed end 114a. The moving end 112a is connected to the rotary element 100a, the fixed end 114a is connected to the suspension 120a, and each suspension 120a is connected by two fixed ends 114a of the two folded springs 110a. In other words, in this embodiment, the suspension 120a (i.e., restraint) is connected to the rotary element 100a via the folded spring 110a. Neither the moving end 112a nor the fixed end 114a is located on the axis L.

As shown in FIG. 8A, since both the moving end 112a and the fixed end 114a are not located on the axis L, a moving distance dm is defined as the distance between the moving end 112a and the axis, a fixed distance df is defined as the distance between the fixed end 114a and the axis L, and a spring length ds is defined as the distance between the moving end 112a and the reference point 114a' of the fixed end 114a. In this embodiment, the fixed distance is less than the moving distance (df<dm), and the spring length is less than the moving distance (ds<dm). As the arrangement of the folded spring 110a shown in FIG. 8A, the spring length ds may be varied according to the rotation of the rotary element 100a. The movement principle applied by the micro-electromechanical apparatus 10a in this embodiment is the first type movement principle mentioned above (as shown in FIG. 3).

Each folded spring 110a in this embodiment comprises a plurality of spans 1101a, 1102a, 1103a and 1104a that are connected in sequence. The directions of extension of the spans 1101a, 1102a, 1103a and 1104a are all parallel to the axis L. In this disclosure, the direction of extension is the extending direction of long sides of the spans 1101a, 1102a, 1103a and 1104a (i.e., Y-axis direction in FIG. 8A). Furthermore, the width Wr of the suspension 120a is greater than the width Ws of each of the spans 1101a, 1102a, 1103a and 1104a. In this embodiment, the lengths (i.e., the dimension along the Y axis) of the spans 1101a, 1102a and 1103a are different from each other. The lengths of the spans 1101a, 1102a and 1103a are decreased along a direction farther away from the axis L. In addition, the length of the span 1101a is greater than that of the span 1102a, and the length of the span 1102a is greater than that of the span 1103a as well. The above-mentioned design of the spans 1101a, 1102a and 1103a with different lengths is used for preventing the resonant frequencies of lateral mode vibration of the folded springs 110a from being too close to the resonant frequencies of torsional mode vibration of the folded springs 110a. However, the disclosure is not limited to the spans having different lengths. For example, in some other embodiments, the lengths of at least two of the spans 1101a, 1102a, 1103a and 1104a are identical.

In this embodiment, the shape of the frame 130a is square, but the disclosure is not limited thereto. Each suspension 120a is connected to the inner side of the frame 130a, and the frame 130a surrounds the suspensions 120a, the folded springs 110a and the rotary element 100a. One end of the suspension 120a is connected to the frame 130a, and the other end of the suspension 120a is connected to the rotary element 100a by the fixed end 114a of the folded spring 110a.

The frame 130a is connected to the four anchors 150a via the four springs 140a, respectively. Each anchor 150a is disposed on the substrate 160a. In this embodiment, when the micro-electromechanical apparatus 10a is to detect an angular velocity, the frame 130a is moved back and forth along the X axis, which drives the rotary element 100a to move back and forth along the X axis as well. When the micro-electromechanical apparatus 10a detects an angular velocity in the Y axis, the rotary element 100a may rotate about the axis L. At this time, the variation of the capacitance between the rotary element 100a of the micro-electromechanical apparatus 10a and a fixed electrode (not shown) on the substrate 160a is detected to calculate the angular velocity.

In this embodiment, the rotational movements of the rotary elements 100a are generated by the elastic deformation of the folded spring 110a, and the elastic deformation of the folded springs 110a are stretch type instead of torsional type. Thus, the types of deformations of the folded springs 110a connected to the rotary elements 100a and types of deformations of springs 140a connected to the frame 130a are all stretch type. Therefore, when manufacturing variation occurs, the variation of resonant frequency of the frame 130a is close to that of the rotary element 100a. Accordingly, the sensitivity of the micro-electromechanical apparatus 10a, which is used in the Y-axis gyroscope, is enhanced.

Figure 9A:
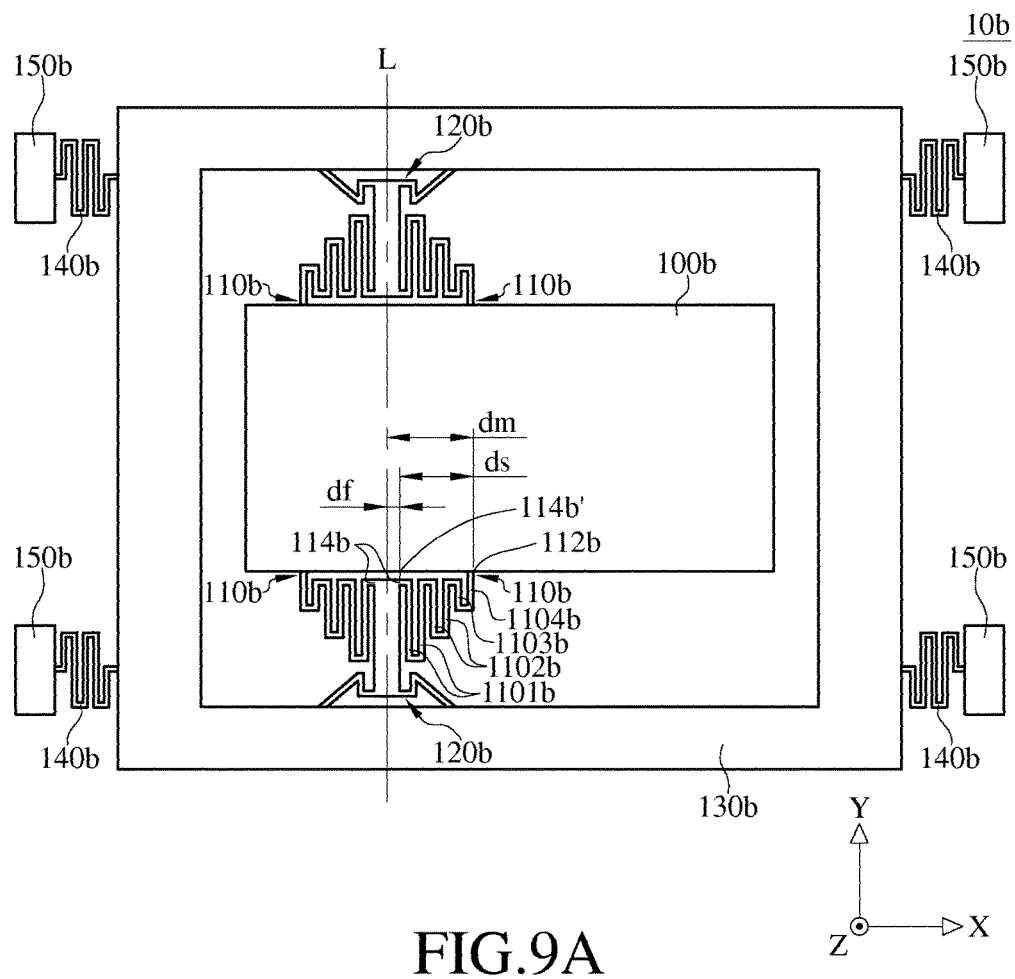
FIG. 9A is a top view of a micro-electromechanical apparatus according to an embodiment of the disclosure.
Figure 9B:
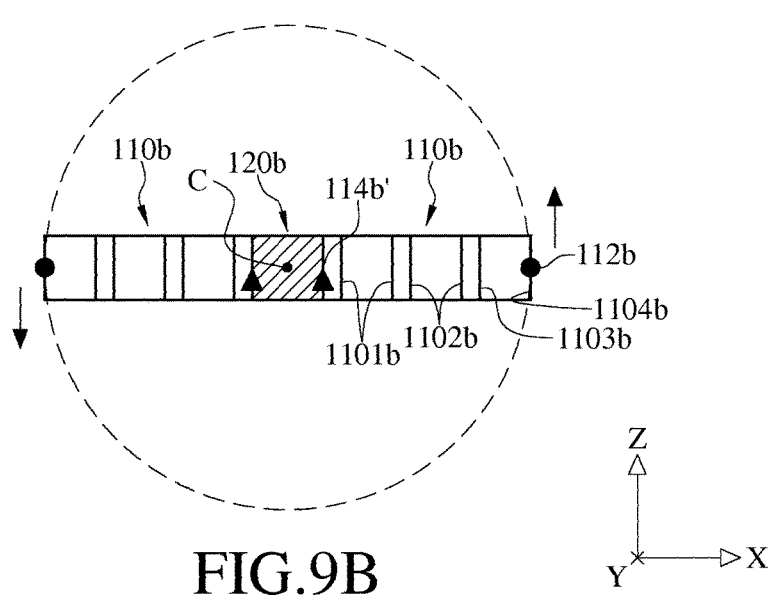
FIG. 9B is a side view of a folded spring and a restraint of a micro-electromechanical apparatus according to an embodiment of the disclosure.
Figure 9C:
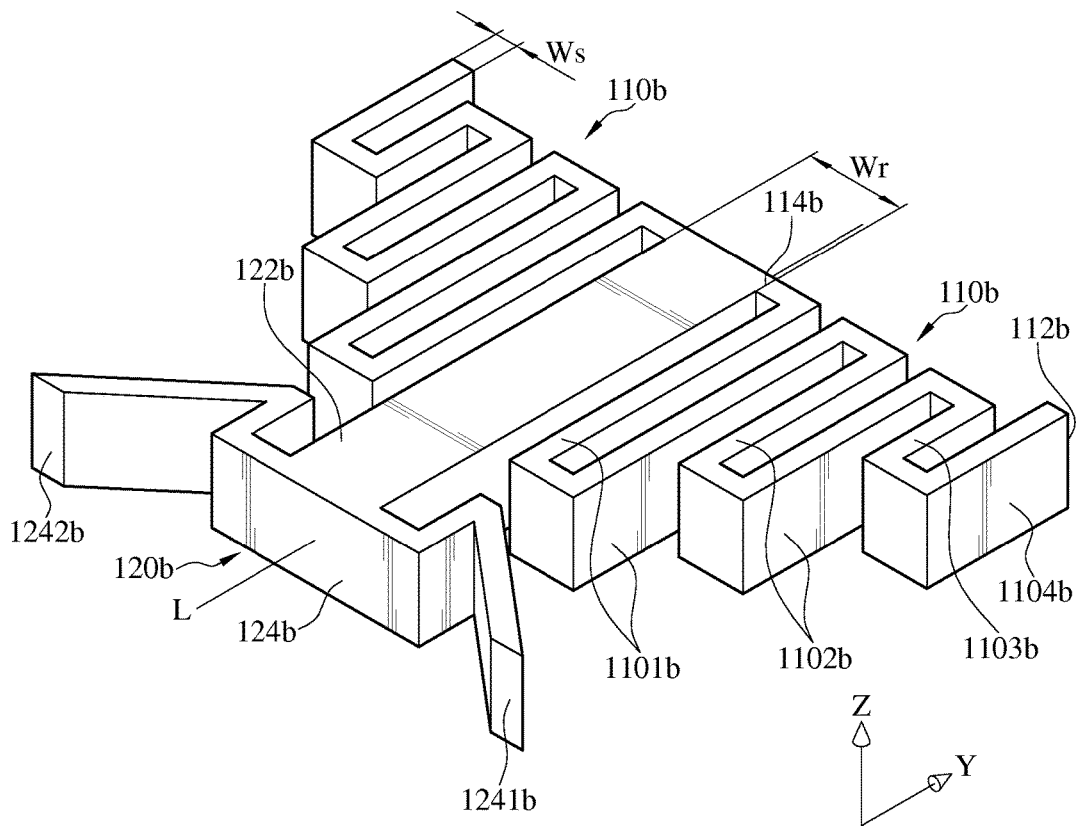
FIG. 9C is a perspective view of a folded spring and a restraint of a micro-electromechanical apparatus according to an embodiment of the disclosure.
Figure 9D:
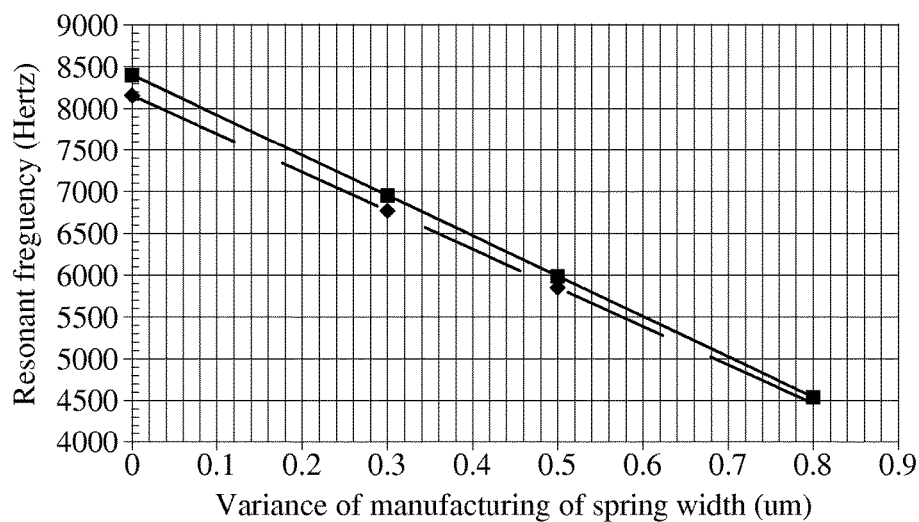
FIG. 9D is a diagram of a relationship between variances of manufacturing of a spring width and resonant frequencies of a frame and a rotary element.

Please refer to FIGS. 9A to 9D, FIG. 9A is a top view of a micro-electromechanical apparatus according to an embodiment of the disclosure, FIG. 9B is a side view of a folded spring and a restraint of a micro-electromechanical apparatus according to an embodiment of the disclosure, FIG. 9C is a perspective view of a folded spring and a restraint of a micro-electromechanical apparatus according to an embodiment of the disclosure, and FIG. 9D is a diagram of a relationship between manufacturing variation of a spring width and resonant frequencies of a frame and a rotary element.

In this disclosure, a micro-electromechanical apparatus 10b is used in, for example, a Y-axis gyroscope adapted to sense an angular velocity along the Y axis. The micro-electromechanical apparatus 10b comprises a rotary element 100b (i.e., a mass in this embodiment), at least one restraint (i.e., a suspension 120b comprising a central suspension 122b and a W-shaped suspension 124b in this embodiment), a plurality of folded springs 110b, an oscillation element (i.e., a frame 130b in this embodiment), a plurality of springs 140b and a plurality of anchors 150b.

The rotary element 100b is capable of rotating about an axis L. The number of the suspensions 120b is two in this embodiment, and the two suspensions 120b are disposed at two opposite sides of the rotary element 100b.

In this embodiment, the number of the folded springs 110b is four, which is exemplary. The folded springs 110b are divided into a plurality of groups, and each group has two folded springs 110b that are symmetrically disposed about the axis L. The folded springs 110b in this embodiment are in a line-symmetrical arrangement about the axis L. Each folded spring 110b has a moving end 112b and a fixed end 114b. The moving end 112b is connected to the rotary element 100b, the fixed end 114b is connected to the central suspension 122b of the suspension 120b, and each suspension 120b is connected by the two corresponding fixed end 114b of the two folded springs 110b. In other words, in this embodiment, the suspension 120b (i.e., restraint) is connected to the rotary element 100*b* via the folded springs 110*b*. Neither the moving end 112*b* nor the fixed end 114*b* is located on the axis L.

As shown in FIG. 9A, since both the moving end 112*b* and the fixed end 114*b* are not located on the axis L, a moving distance dm is defined as a distance between the moving end 112*b* and the axis L, a fixed distance df is defined as a distance between the fixed end 114*b* and the axis L, a spring length ds is defined as a distance between the moving end 112*b* and the reference point 114*b*' of the fixed end 114*b*. In this embodiment, the fixed distance df is less than the moving distance dm, and the spring length ds is less than the moving distance dm. In this embodiment, since both the moving end 112*b* and the fixed end 114*b* are not located on the axis L, the spring length ds may be varied according to the rotation of the rotary element 100*b*. The movement principle applied by the micro-electromechanical apparatus 10*a* in this embodiment is the first type movement principle (as shown in FIG. 3).

Each folded spring 110*b* in this embodiment comprises a plurality of spans 1101*b*, 1102*b*, 1103*b* and 1104*b* that are connected in sequence. The direction of extension of the spans 1101*b*, 1102*b*, 1103*b* and 1104*b* is parallel to the axis L. In other words, the direction of extension is the extending direction of long sides of the spans 1101*b*, 1102*b*, 1103*b* and 1104*b* (i.e., Y direction in FIG. 9A).

In this embodiment, the lengths (i.e., the dimensions of the spans along Y axis) of the spans 1101*b*, 1102*b* and 1103*b* are different from each other. The lengths of the spans 1101*b*, 1102*b* and 1103*b* are decreased along a direction farther away from the axis L. In addition, the length of the span 1101*b* is greater than that of the span 1102*b*, and the length of the span 1102*b* is greater than that of the span 1103*b* as well. The above-mentioned design of the spans 1101*b*, 1102*b* and 1103*b* with different lengths is not limited to the spans having different lengths. For example, in other embodiments, the lengths of at least two of the spans 1101*b*, 1102*b*, 1103*b* and 1104*b* are identical.

In this embodiment, the shape of the frame 130*b* is square, but the disclosure is not limited thereto. Each suspension 120*b* is connected to the inner side of the frame 130*b*, and the frame 130*a* surrounds the suspensions 120*b*, the folded springs 110*b* and the rotary elements 100*b*. In this embodiment, the restraint is a suspension 120*b* which is composed of a central suspension 122*b* and a W-shaped suspension 124*b*. The W-shaped suspension 124*b* is connected to the frame 130*b*. One end of the central suspension 122*b* is connected to the fixed ends 114*b* of the folded springs 110*b*. In this embodiment, the W-shaped suspension 124*b* includes a first end 1241*b* and second end 1242*b* which are connected to the frame 130*b*, respectively. The first end 1241*b* and the second end 1242*b* of the W-shaped suspension 124*b* are symmetrically disposed about the axis L. Also, the width Wr of the central suspension 122*b* of the suspension 120*b* is greater than the width Ws of each of the spans 1101*b*, 1102*b* and 1103*b*. By the arrangement of the first end 1241*b* and the second end 1242*b* of the W-shaped suspension 124*b* of the suspension 120*b*, the stress at the connection portion between the suspension 120*b* and the frame 130*b* is lowered, which prevents failure (e.g., fracturing or breaking) at the connection portion between the suspension 120*b* and the frame 130*b*. Hence the reliability of the micro-electromechanical apparatus 10*b* during operation is enhanced.

Moreover, the frame 130*b* is connected to the four anchors 150*b* via the four springs 140*b*. The anchors 150*b* are fixedly disposed on a substrate (not shown). Thus, each anchor 150*b* is regarded as a fixed point. During operation, the frame 130*b* is moved back and forth along the X axis to drive the rotary element 100*b* to oscillate along the X axis as well. When the micro-electromechanical apparatus 10*b* detects the angular velocity along the Y axis, the rotary element 100*b* rotates about the axis L. At this time, the variation of the capacitance between a fixed electrode (not shown) on the substrate (not shown) and the rotary element 100*b* of the micro-electromechanical apparatus 10*b* is detected to calculate the angular velocity.

The rotary element 100*b* in this embodiment is rotated according to the stretch-type deformation of the folded spring 110*b*. Therefore, both the stiffness of the folded spring 110*b* and that of the spring 140*b* are substantially in direct proportion to width of springs. As a result, referring to FIG. 9D, no matter what the manufacturing variation of the spring width of the folded springs 110*b* are, the resonant frequency (solid lines) of the frame 130*b* is close to the resonant frequency (dotted lines) of the rotary element 100*b*. Thus, when the micro-electromechanical apparatus 10*b* detects the angular velocity along the Y axis, the rotary element 100*b* has the maximum amount of rotation, which enhances the sensitivity of the Y-axis gyroscope.

Figure 10A:
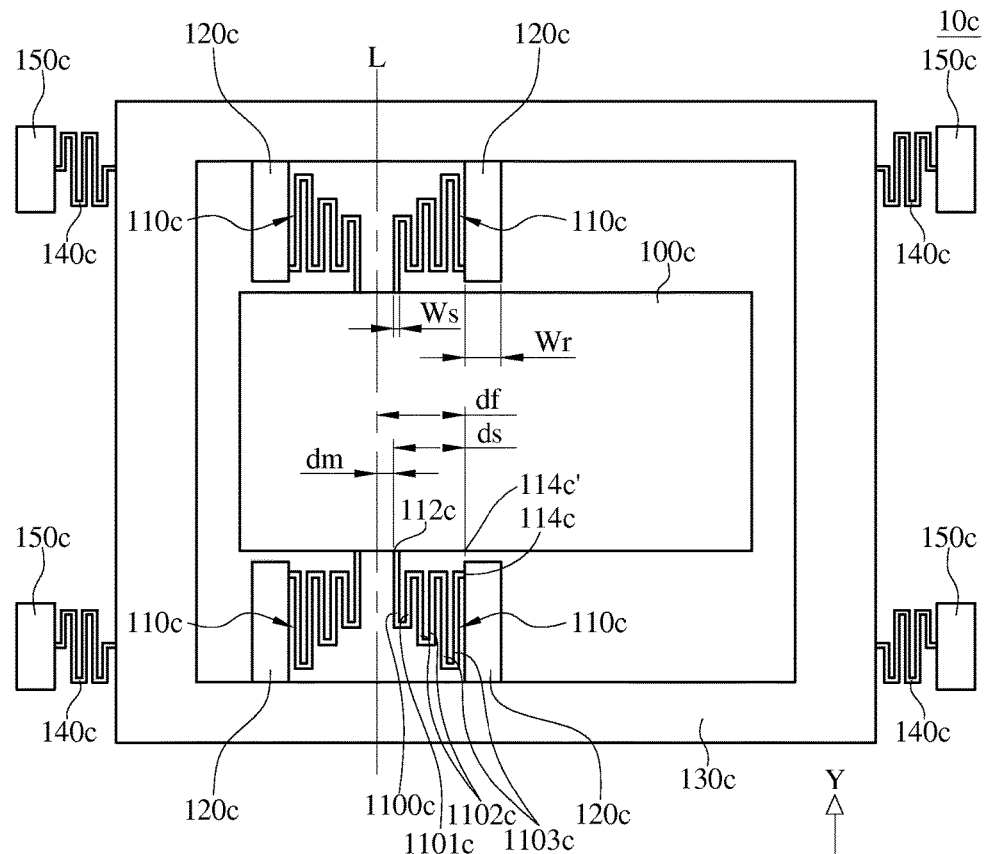
FIG. 10A is a top view of a micro-electromechanical apparatus.
Figure 10B:
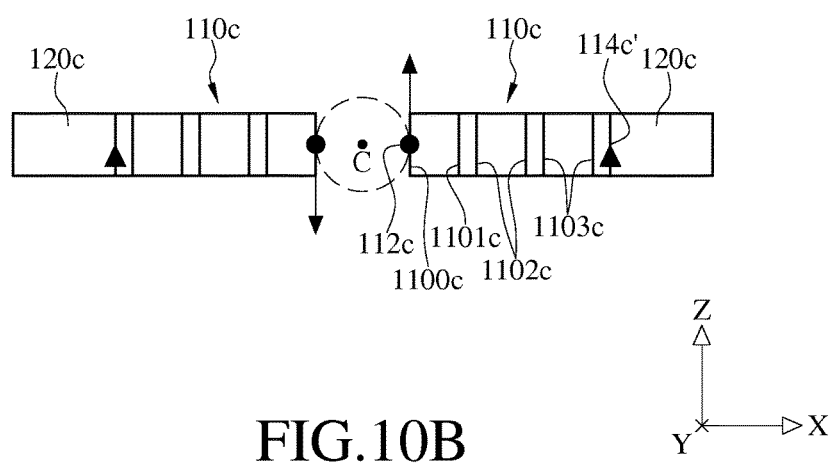
FIG. 10B is side view of a folded spring and a restraint of a micro-electromechanical apparatus according to an embodiment of the disclosure.

Please refer to FIGS. 10A and 10B, FIG. 10A is a top view of a micro-electromechanical apparatus, and FIG. 10B is side view of a folded spring and a restraint of a micro-electromechanical apparatus according to an embodiment of the disclosure. The micro-electromechanical apparatus 10*c* in this embodiment is used in a Y-axis gyroscope for detecting an angular velocity in Y axis. The micro-electromechanical apparatus 10*c* comprises a mass (i.e., a rotary element 100*c* in this embodiment), at least one restraint (i.e., a suspension 120*c* in this embodiment), a plurality of folded springs 110*c*, an oscillation element (i.e., a frame 130*c* in this embodiment), a plurality of springs 140*c* and a plurality of anchors 150*c*.

The rotary element 100*c* is capable of rotating about an axis L. The number of the suspensions 120*c* is four. Two of the suspensions 120*c* are disposed on one side of the rotary element 100*c*, and the other two suspensions 120*c* are disposed on the opposite side of the rotary element 100*c*.

The number of the folded springs 110*c* is four, for exemplary. The folded springs 110*c* are divided into a plurality of groups, and each group has two folded springs 110*c* that are symmetrically disposed about the axis L. The folded springs 110*c* in this embodiment are in the line-symmetrical arrangement about the axis L. In this embodiment, each folded spring 110*c* has a moving end 112*c* and a fixed end 114*c*. The moving end 112*c* is connected to the rotary element 100*c*, the fixed end 114*c* is connected to the suspension 120*c*, and each suspension 120*c* is connected by the corresponding fixed end 114*c* of the folded springs 110*c*. In other words, in this embodiment, the suspension 120*c* (i.e., restraint) is connected to the rotary element 100*c* via the folded springs 110*c*. Neither the moving end 112*c* nor the fixed end 114*c* is not located on the axis L.

As shown in FIG. 10A, since the moving ends 112*c* and the fixed ends 114*c* are not located on the axis L, a moving distance dm is defined as a distance between the moving end 112*c* and the axis L, a fixed distance df is defined as a distance between the fixed end 114*c* and the axis L, and a spring length ds is defined as a distance between the moving end 112*c* and the reference point 114*c*' of the fixed end 114*c*. In this embodiment, the fixed distance df is greater than the moving distance dm, and the spring length ds is less than the fixed distance df. As the arrangement of the folded spring 110*c* shown in FIG. 10A, the spring length ds is varied according to the rotation of the rotary element 100*c*. The movement principle applied by the micro-electromechanical apparatus 10c is the fourth type movement principle described in FIG. 6.

In this embodiment, each folded spring 110c comprises a plurality of spans 1100c, 1101c, 1102c and 1103c that are connected in sequence. The direction and extension of the spans 1100c, 1101c, 1102c and 1103c is parallel to the axis L. Also, the width Wr of the suspension 120c is greater than the width Ws of each span 1100c, 1101c, 1102c and 1103c. In this embodiment, the length of the spans 1101c, 1102c and 1103c (i.e., the dimensions along the Y direction) are different from each other, and the lengths of the spans 1101c, 1102c and 1103c are increased along a direction farther away from the axis L. That is to say, the length of the span 1101c is less than that of the span 1102c, and the length of the span 1102c is less than the span 1103c as well. However, the disclosure is not limited to the feature of the above-mentioned spans with different lengths. For example, in other embodiments, the lengths of at least two of the spans 1101c, 1102c and 1103c are identical.

In this embodiment, the shape of the frame 130c is square, but the disclosure is not limited thereto. Each suspension 120c is connected to the inner side of the frame 130c, such that the frame 130c surrounds the suspensions 120c, the folded springs 110c and the rotary element 100c. One end of the suspension 120c is connected to the frame 130c, and the other end of the suspension 120c is connected to the rotary element 100c by the fixed end 114c of the folded spring 110c.

In addition, the frame 130c is connected to the four anchors 150c via the four springs 140c. The anchors 150c are disposed on a substrate (not shown). During operation, the frame 130c is moved back and forth along X-axis, which drives the rotary element 100c to move along the X axis as well. When the micro-electromechanical apparatus 10c senses an angular velocity along the Y axis, the rotary element 100c rotates about axis L. At this time, the variation of the capacitance between the rotary element 100c of the micro-electromechanical apparatus 10c and a fixed electrode (not shown) of the substrate (not shown) is detected to calculate and measure the angular velocity in Y-axis.

Figure 11A:
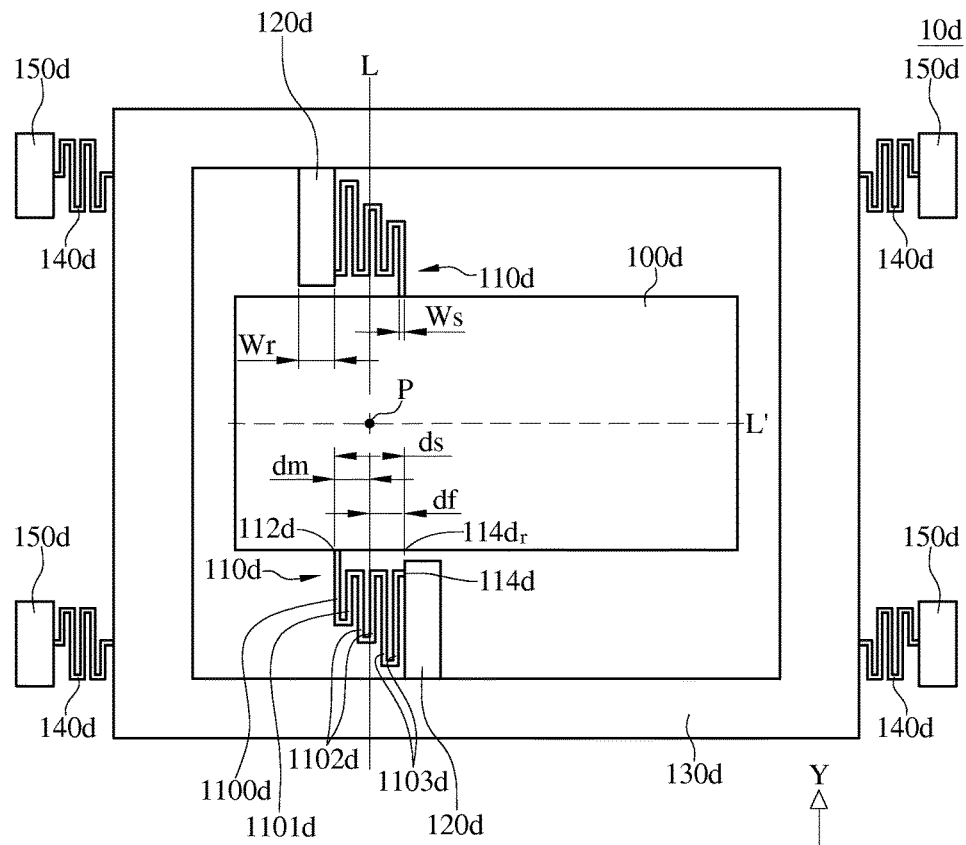
FIG. 11A is a top view of a micro-electromechanical apparatus according to an embodiment of the disclosure.
Figure 11B:
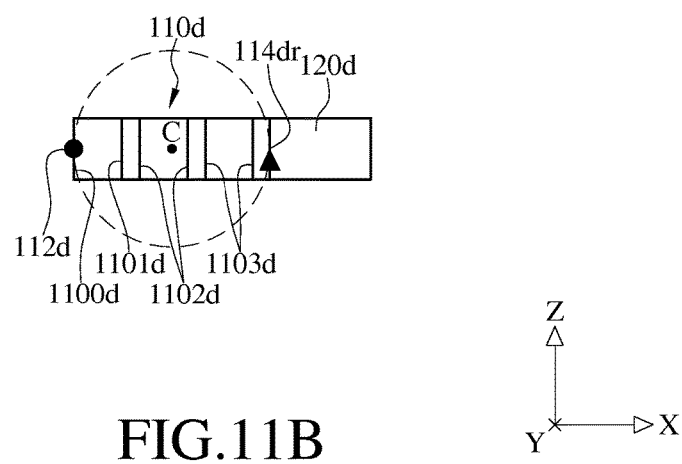
FIG. 11B is a side view of a folded spring and a restraint of a micro-electromechanical apparatus according to an embodiment of the disclosure.

Please refer to FIGS. 11A and 11B, FIG. 11A is a top view of a micro-electromechanical apparatus according to an embodiment of the disclosure, and FIG. 11B is a side view of a folded spring and a restraint of a micro-electromechanical apparatus according to an embodiment of the disclosure. In this disclosure, a micro-electromechanical apparatus 10d is used as, for example, a Y-axis gyroscope for sensing an angular velocity along the Y axis. The micro-electromechanical apparatus 10d comprises a mass (i.e., a rotary element 100d in this embodiment), at least one restraint (i.e., a suspension 120d in this embodiment), a plurality of folded springs 110d, an oscillation element (i.e., a frame 130d in this embodiment), a plurality of springs 140d and a plurality of anchors 150d.

The rotary element 100d is capable of rotating about an axis L. The number of the suspensions 120d is two, and the two suspensions 120d are disposed at two opposite sides of the rotary element 100d. In this embodiment, the number of the folded springs 110d is two, which is for exemplary. The two folded springs 110d are symmetrically disposed about a middle point P which is an intersection of the axis L and a central line L' of the rotary element along the X axis as shown in FIG. 11A. In this embodiment, the two folded springs 110d are in a point-symmetry arrangement with respect to point P. Each folded spring 110d has a moving end 112d and a fixed end 114d. The moving end 112d is connected to the rotary element 100d, the fixed end 114d is connected to the suspension 120d, and the suspensions 120d are connected to the rotary element 100d by the corresponding fixed ends 114d of the folded springs 110d, respectively. In other words, the suspension 120d (i.e., restraint) in this embodiment are connected to the rotary element 100d via the corresponding folded springs 110d. Neither the moving end 112d nor the fixed end 114d is located on the axis L.

Referring to FIG. 11A, since the moving end 112d and the fixed end 114d are not located on the axis L, a moving distance dm is defined as a distance between the moving end 112d and the axis L, a fixed distance df is defined as a distance between the fixed end 114d and the axis L, and a spring length ds is defined as a distance between the moving end 112d and the reference point 114d, of the fixed end 114d. In this embodiment, the fixed distance df is equal to the moving distance dm. As the arrangement of the folded springs 110d shown in FIG. 11A, spring lengths of the folded springs 110d are varied according to the rotation of the rotary element 100d. The movement principle applied by the micro-electromechanical apparatus 10d in this embodiment is the third type movement principle shown in FIG. 5.

In this embodiment, each folded spring 110d comprises a plurality of spans 1100d, 1101d, 1102d and 1103d that are connected in sequence. The direction of extension (i.e., Y-axis direction in FIG. 11C) of the spans 1100d, 1101d, 1102d and 1103d is parallel to the axis L. In addition, the width Wr of the suspension 120d is greater than the width Ws of each of the spans 1100d, 1101d, 1102d and 1103d. The lengths of the spans 1101d, 1102d and 1103d are different from each other. The lengths of the spans 1101d, 1102d and 1103d are increased along a direction approaching the suspension 120d. That is to say, the length of the span 1101d is less than that of the span 1102d, and the length of the span 1102d is less than that of the span 1103d as well. However, the disclosure is not limited to the feature of the spans 1101d, 1102d and 1103d with different lengths. For example, in other embodiments, the lengths of at least two spans 1101d, 1102d and 1103d are identical.

The shape of the frame 130d in this embodiment is square, but the disclosure is not limited to the shape of the frame 130d. Each suspension 120d is connected to the inner side of the frame 130d, such that the frame 130c surrounds the suspensions 120d, the folded springs 110d and the rotary element 100d. Also, in this embodiment, one end of the suspension 120d is connected to the frame 130d, and the other end of the suspension 120d is connected to the rotary element 100d by the corresponding fixed end 114d of the folded spring 110d.

The frame 130d is connected to the four anchors 150d via the four springs 140d. During operation, the frame 130d is moved back and forth along the X axis, which drives the rotary element 100d to oscillate along the X axis accordingly. When the micro-electromechanical apparatus 10d detects an angular velocity in the Y axis, the rotary element 100d rotates about the axis L. At this time, the variation of the capacitance between the rotary element 100d of the micro-electromechanical apparatus 10d and a fixed electrode (not shown) of the substrate (not shown) is detected to calculate the angular velocity.

Figure 12:
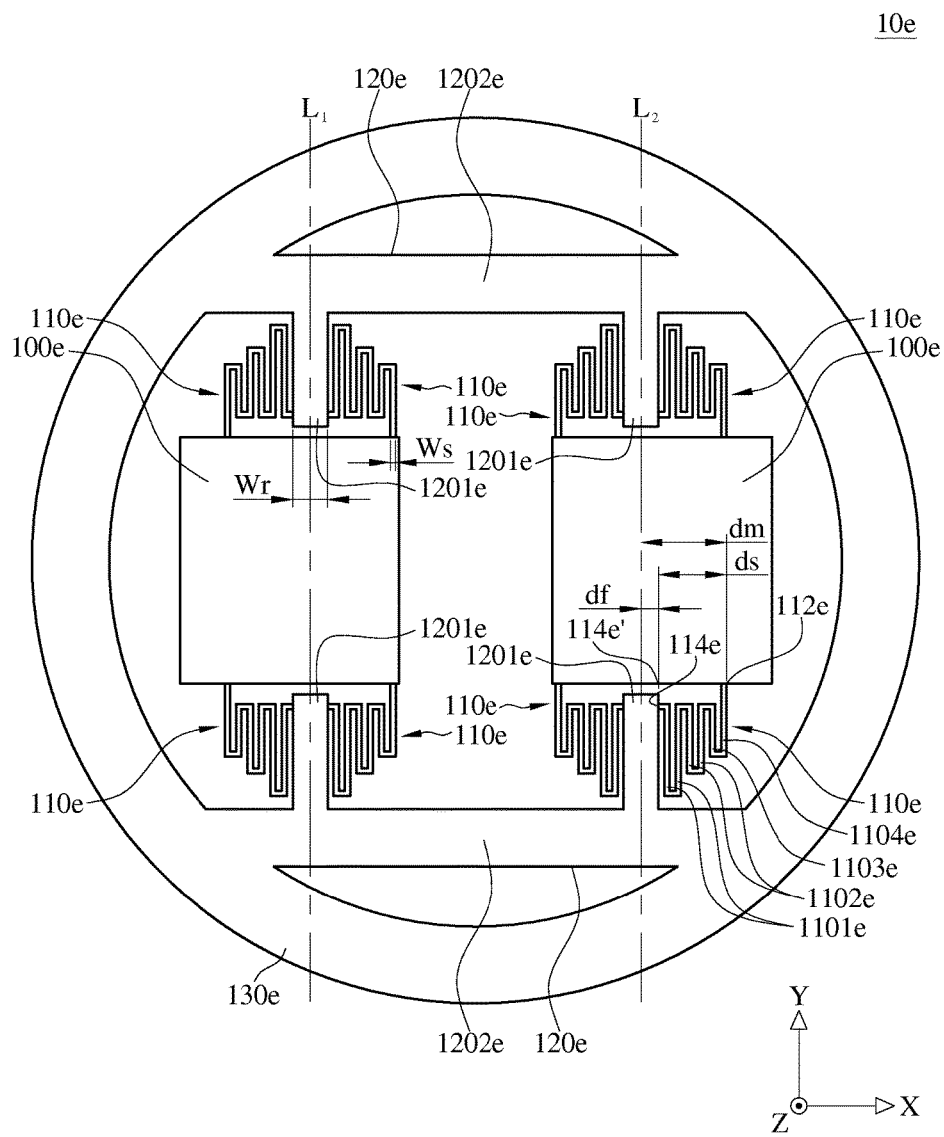
FIG. 12 is a top view of a micro-electromechanical apparatus according to an embodiment of the disclosure.

Please refer to FIG. 12, which is a top view of a micro-electromechanical apparatus according to an embodiment of the disclosure. The micro-electromechanical apparatus 10e in this embodiment of the disclosure is used in, for example, a differential Y-axis gyroscope for sensing an angular velocity along the Y axis. When the angular velocity is detected along the Y axis, two rotary elements 100e of the microelectromechanical apparatus 10 rotate along two opposite directions, respectively, thereby decreasing noise disturbance. The micro-electromechanical apparatus 10e comprises at least two masses (i.e., two rotary elements 100e in this embodiment), at least one restraint (i.e., a suspension 120e in this embodiment), a plurality of folded springs 110e and an oscillation element (i.e., a frame 130e in this embodiment).

The number of the rotary elements 100e is two, and the two rotary elements 100e are capable of rotating about two axes L1 and L2, respectively. The number of the suspensions 120e is two, and the two suspensions 120e are disposed on two opposite sides of the two rotary elements 100a. Each suspension 120e includes a main suspension 1202e and two extending suspensions 1201e. The number of the folded springs 110e is eight, which is for exemplary. The folded springs 110e are divided into a plurality of groups, and each group has two folded springs 110e that are symmetrically disposed about the axis L1 or axis L2. The folded springs 110e in this embodiment are in the line-symmetrical arrangement. Each folded spring 110e has a moving end 112e and a fixed end 114e. The moving end 112e is connected to the rotary element 100e, and the fixed end 114e is connected to the suspension 120e. In other words, in this embodiment, the suspension 120e (i.e., restraint) are connected to the rotary element 100e via the folded springs 110e. The moving end 112e and the fixed end 114e of the folded springs 110e are not located on the axes L1 and L2.

As shown in FIG. 12, since the moving ends 112e and the fixed ends 114e are not located on the corresponding axes L1 and L2, a moving distance dm is defined as a distance between the moving end 112e of the folded spring 110e and the corresponding axis L1 or L2, a fixed distance df is defined as a distance between the fixed end 114e and the corresponding axis L1 or L2, and a spring length ds is defined as a distance between the moving end 112e and the reference point 114e' of the fixed end 114e. In this embodiment, the fixed distance df is less than the moving distance dm, and the spring length ds is less than the moving distance dm. As the arrangement of the folded spring 110e shown in FIG. 12, spring lengths ds of the folded springs 110e are varied according to the rotation of the rotary element 100e. The movement principle applied by the micro-electromechanical apparatus 10e in this embodiment is the above-mentioned first type movement principle shown in FIG. 3.

In this embodiment, each folded spring 110e comprises a plurality of spans 1101e, 1102e, 1103e and 1104e which are connected in sequence. The directions of extension of the spans 1101e, 1102e, 1103e and 1104e are parallel to axis L1 or L2. Also, the width Wr of the extending suspension 1201 of the suspension 120e is greater than the width Ws of each span 1101e, 1102e, 1103e and 1104e.

The lengths (i.e., the dimension along the Y axis) of the spans 1101e, 1102e and 1103e are different from each other. The lengths of the spans 1101e, 1102e and 1103e are decreased along a direction farther away from the axis L1 or L2. That is to say, the length of the span 1101e is greater than that of the span 1102e, and the length of the span 1102e is greater than that of the span 1103e. However, the disclosure is not limited to the feature of the spans with different lengths. For example, in other embodiments, the lengths of at least two of the spans 1101e, 1102e and 1103e are identical.

In this embodiment, the shape of the frame 130e is ring, but the disclosure is not limited thereto. Each suspension 120e is connected to the inner side of the frame 130e, such that the frame 130e surrounds the suspensions 120e, the folded springs 110e and the rotary element 100e.

Figure 13:
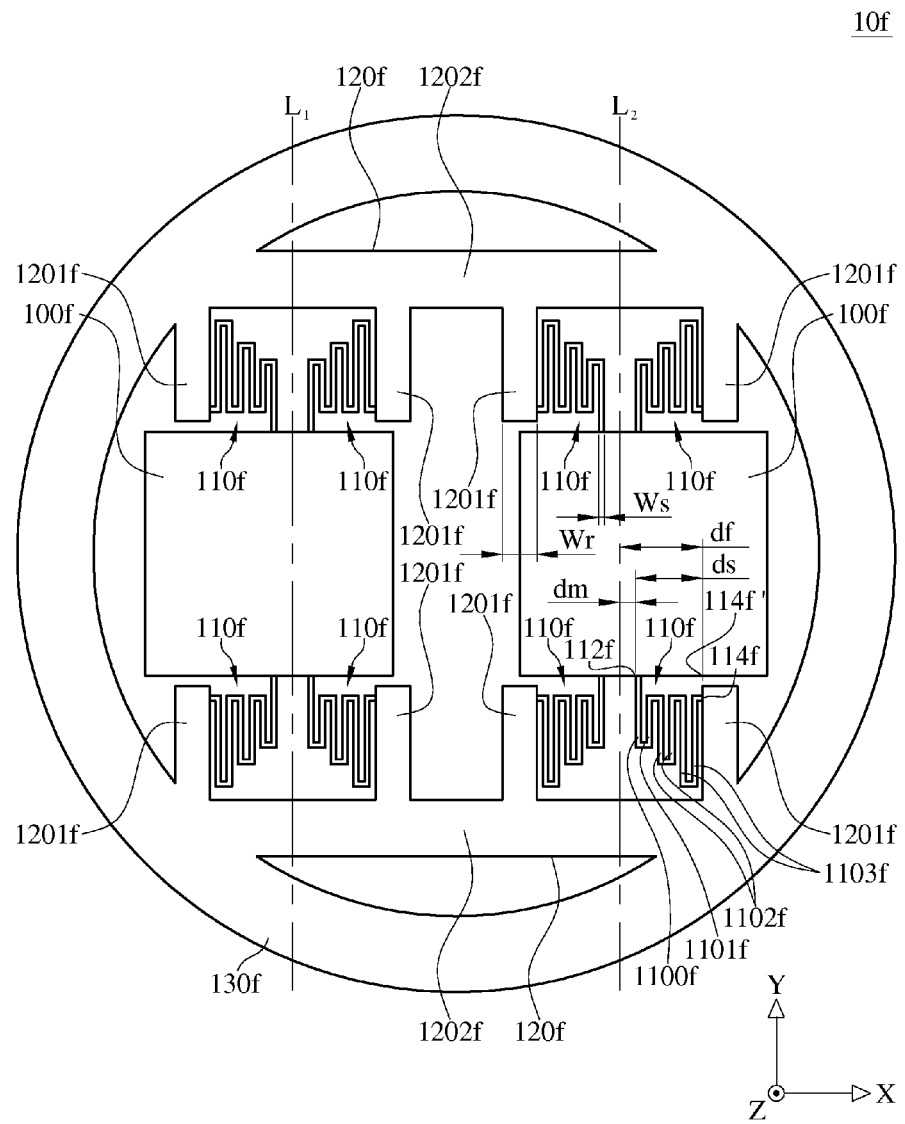
FIG. 13 is a top view of a micro-electromechanical apparatus according to an embodiment of the disclosure.

Please refer to FIG. 13 is a top view of a micro-electromechanical apparatus according to an embodiment of the disclosure. The micro-electromechanical apparatus 10f in this embodiment is used in, for example, a differential Y-axis accelerometer (gyroscope) for detecting an angular velocity along a Y axis, which has lower noise disturbance. The micro-electromechanical apparatus 10f comprises at least two masses (i.e., two rotary elements 100f in this embodiment), at least one restraint (i.e., at least one suspension 120f in this embodiment), a plurality of folded springs 110f and an oscillation element (i.e., a frame 130f in this embodiment).

The number of the rotary elements 100f is two, which is for exemplary. The two rotary elements 100f are capable of rotating about axes L1 and L2, respectively. The number of the suspensions 120f is two, and the two suspensions 120f are disposed on two sides of the two rotary elements 100f, respectively. Each suspension 120f includes a main suspension 1202f and four extending suspensions 1201f. Two ends of each main suspension 1202f are connected to the ring-shaped frame 130f and each extending suspension 1201f is connected to the rotary elements 100f by a corresponding fixed ends 114f of the folded springs 110f.

The number of the folded springs 110f in this embodiment is eight, which are for exemplary. The folded springs 110f are divided into a plurality of groups, and each group has two folded springs 110f that are symmetrically disposed about the axis L1 or L2. Each folded spring 110f has a moving end 112f and a fixed end 114f. The moving end 112f is connected to the rotary element 100f, and the fixed end 114f is connected to the extending suspension 1201f of the suspension 120f. In other words, the suspension 120f (i.e., restraint) in this embodiment is connected to the rotary element 100f via the folded spring 110f. The moving end 112f and the fixed end 114f of each folded spring 110f are not located on the axes L1 and L2.

As shown in FIG. 13, since the moving ends 112f and the fixed ends 114f are not located on the axes L1 and L2, a moving distance dm is defined as a distance between the moving end 112f of the folded spring 110f and the corresponding axis L1 or L2, a fixed distance df is defined as a distance between the fixed end 114f and the corresponding axis L1 or L2, and a spring length ds is defined as a distance between the moving end 112f and the corresponding reference point 114f of the fixed end 114f. In this embodiment, the fixed distance df is greater than the moving distance dm, and the spring length ds is less than the fixed distance df. As shown in FIG. 13, by the arrangement of the folded springs 110f, the spring lengths ds are varied according to the rotation of the rotary element 100f. The movement principle applied by the micro-electromechanical apparatus 10f is the fourth type movement principle shown in FIG. 6.

Each folded spring 110f comprises a plurality of spans 1100f, 1101f, 1102f and 1103f that are connected in sequence. The direction of extension of the spans 1100f, 1101f, 1102f and 1103f is parallel to the axis L1 or L2. Also, the width Wr of the extending suspension 1201f of the suspension 120f is greater than the width Ws of each of the spans 1101f, 1102f and 1103f.

In this embodiment, the lengths (i.e., the dimension along the Y axis) of the spans 1101f, 1102f and 1103f are different from each other. The lengths of the spans 1101f, 1102f and 1103f are increased along a direction farther away from the corresponding axis L1 or L2. In addition, the length of the span 1101f is less than that of the span 1102e, and the span 1102*f* is less than that of the span 1103*f*. However, the disclosure is not limited to the feature that the lengths of the spans are different from each other. For example, in other embodiments, the lengths of at least two of the spans 1101*f*, 1102*f* and 1103*f* are identical.

In this embodiment, the shape of the frame 130*f* is rig shape, but the disclosure is not limited thereto. Each suspension 120*f* is connected to the inner side of the ring-shaped frame 130*f*, such that the frame 130*f* surrounds the suspensions 120*f*, the folded springs 110*f* and the rotary element 100*f*.

Figure 14A:
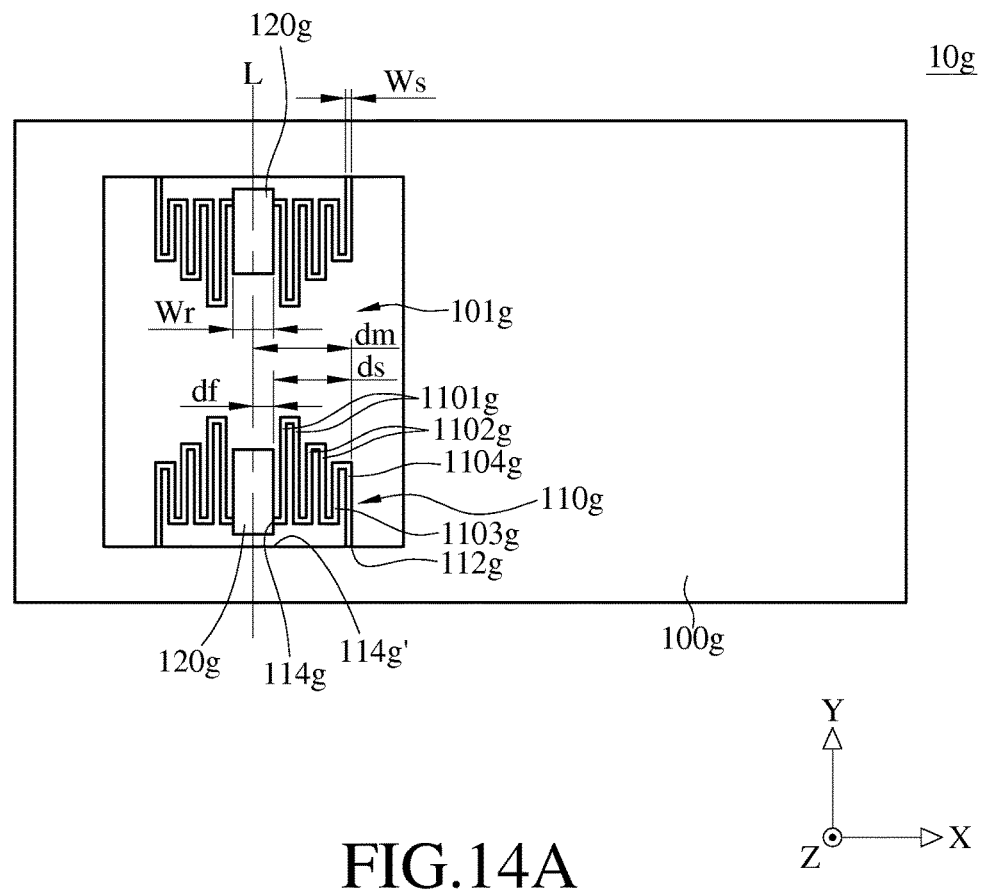
FIG. 14A is a top view of a micro-electromechanical apparatus according to an embodiment of the disclosure.
Figure 14B:
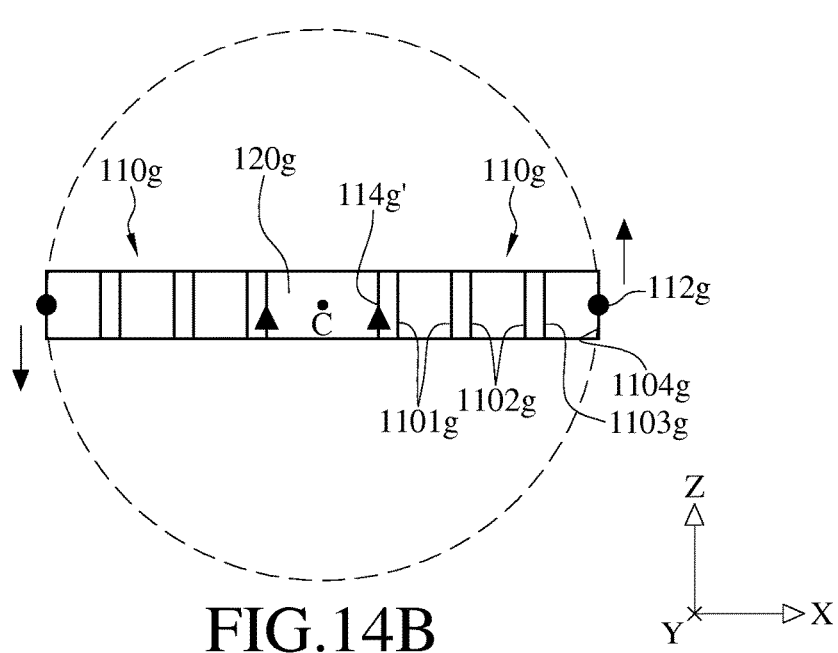
FIG. 14B is a side view of a folded spring and a restraint of a micro-electromechanical apparatus according to an embodiment of the disclosure.

Please refer to FIGS. 14A and 14B. FIG. 14A is a top view of a micro-electromechanical apparatus according to an embodiment of the disclosure, and FIG. 14B is a side view of a folded spring and a restraint of a micro-electromechanical apparatus according to an embodiment of the disclosure. The micro-electromechanical apparatus 10*g* in this embodiment is used in, for example, a Z-axis accelerometer for sensing an acceleration along the Z axis. The micro-electromechanical apparatus 10*g* comprises at least one mass (i.e., a hollow rotary element in this embodiment), at least one restraint (i.e., an anchor 120*g* in his embodiment) and a plurality of folded springs 110*g*.

The number of the rotary element 100*g* is one, which is for exemplary. The rotary element 100*g* is capable of rotating about an axis L and includes an opening 101*g*. The number of the restraints is two, and the two restraints are located near two opposite inner sides of the opening 101*g* of the rotary element 100*g*. The restraints are anchors 120*g*, which means the restraint is fixedly disposed on the substrate (not shown).

In this embodiment, the number of the folded springs 110*g* is four, which is for exemplary. The folded springs 110*g* are divided into a plurality of groups, and each group has two folded springs 110*g* that are symmetrically disposed about the axis L. Each folded spring 110*g* has a moving end 112*g* and a fixed end 114*g*. The moving end 112*g* is connected to the rotary element 100*g*, and the fixed end 114*g* is connected to the anchor 120*g*. Two opposite sides of the opening 101*g* of the rotary element 100*g* are connected by the two moving ends 112*g* of the folded springs 110*g*, respectively. In other words the anchor 120*g* (i.e., restraint) in this embodiment is connected to the rotary element 100*g* via the folded spring 110*g*. Also, neither the moving end 112*g* nor the fixed end 114*g* is located on the axis L.

As shown in FIG. 14A, since the moving end 112*g* and the fixed end 114*g* are not located on the axis L, a moving distance dm is defined as a distance between the moving end 112*g* of the folded spring 110*g* and the axis L, a fixed distance df is defined as a distance between the fixed end 114*g* and the axis L, and a spring length ds is defined as a distance between the moving end 112*g* and the reference point 114*g'* of the fixed end 114*g*. In this embodiment, the fixed distance df is less than the moving distance dm, and the spring length ds is less than the moving distance dm. By the arrangement of the folded spring 110*f* shown in FIG. 14A, the spring lengths ds are varied according to the rotation of the rotary element 100*g*. In this embodiment, the movement principle applied by the micro-electromechanical apparatus 10*g* is the above-mentioned first type movement principle shown in FIG. 3.

Each folded spring 110*g* in this embodiment comprises a plurality of spans 1101*g*, 1102*g*, 1103*g* and 1104*g* that are connected in sequence. The direction of extension of the spans 1101*g*, 1102*g*, 1103*g* and 1104*g* is parallel to the axis L. Also, the width Wr of the anchor 120*g* is greater than the width Ws of each of the spans 1101*g*, 1102*g*, 1103*g* and 1104*g*. In this embodiment, the lengths of the spans 1101*g*, 1102*g* and 1103*g* (dimensions along Y-axis direction) are different from each other. The lengths of the spans 1101*g*, 1102*g* and 1103*g* are decreased along a direction farther away from the axis L. In other words, the length of the span 1101*g* is greater than that of the span 1102*g*, and the length of the span 1102*g* is greater than that of the span 1103*g* as well. However, the disclosure is not limited to the above-mentioned feature that the lengths of the spans are different from each other. For example, the lengths of at least two of the spans 1101*g*, 1102*g* and 1103*g* are identical in an embodiment.

However, the feature that the spring length is less than the moving distance disclosed in the above-mentioned embodiments are only for exemplary, and the disclosure is not limited thereto. In other embodiments, for example, the configurations of all elements of the micro-electromechanical apparatus may be adjusted to make the spring length being greater than the moving distance. In other embodiments, the frame can be used as restraint. It means that the frame can be used to restrain the movement of the fixed end of the folded spring.

Figure 11C:
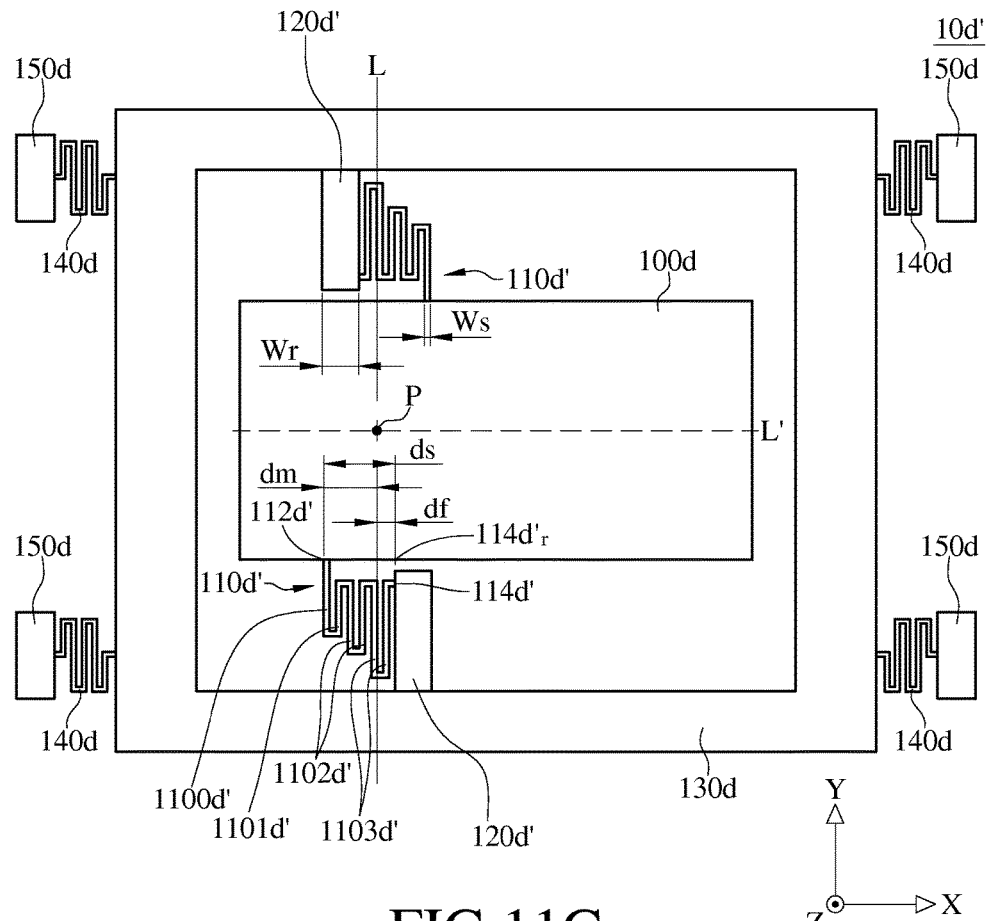
FIG. 11C is a top view of a micro-electromechanical apparatus according to an embodiment of the disclosure.
Figure 11D:
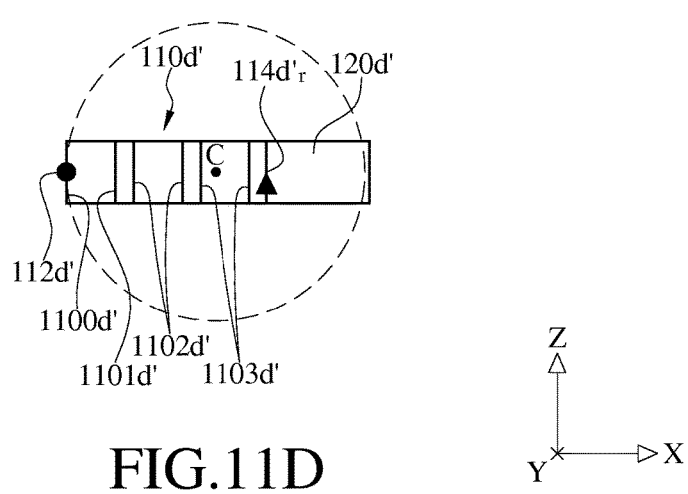
FIG. 11D is a side view of a folded spring and a restraint of a micro-electromechanical apparatus according to an embodiment of the disclosure.

Please refer to FIGS. 11C and 11D. FIG. 11C is a top view of a micro-electromechanical apparatus according to an embodiment of the disclosure, and FIG. 11D is a side view of a folded spring and a restraint of a micro-electromechanical apparatus according to an embodiment of the disclosure. The micro-electromechanical apparatus 10*d'* is used in, for example, a Y-axis gyroscope for sensing an angular velocity along the Y axis. The micro-electromechanical apparatus 10*d'* comprises a mass (i.e., a rotary element 100*d* in this embodiment), at least one restraint (i.e., a suspension 120*d'* in this embodiment), a plurality of folded springs 110*d*, an oscillation element (i.e., a frame 130*d* in this embodiment), a plurality of springs 140*d* and a plurality of anchors 150*d*.

The rotary element 100*d* is capable of rotating about an axis L. The number of the suspensions 120*d'* is two, and the two suspensions 120*d'* are disposed on two opposite sides of the rotary element 100*d*. The number of the folded springs 110*d'* in this embodiment is two, which is exemplary. The two folded springs 110*d'* are symmetrically disposed about a middle point P which is an intersection of the axis L and a central line L' of the rotary element along the X axis. In this embodiment, the two folded springs 110*d'* are in a point-symmetry arrangement about the middle point P. Each folded spring 110*d'* has a moving end 112*d'* and a fixed end 114*d'*. The moving end 112*d'* is connected to the rotary element 100*d*, and the fixed end 114*d'* is connected to the suspension 120*d'*, and each suspension 120*d'* connects by one fixed end 114*d'* of the folded spring 110*d'*. In other words, in this embodiment, the suspension 120*d'* (i.e., restraint) is connected to the rotary element 100*d* via the folded spring 110*d'*. Neither the moving end 112*d'* nor the fixed end 114*d'* is located on the axis L.

As shown in FIG. 11C, since the moving end 112*d'* and the fixed end 114*d'* are not located on the axis L, a moving distance dm is defined as a distance between the moving end 112*d'* and the axis L, a fixed distance df is defined as a distance between the fixed end 114*d'* and the axis L, and a spring length ds is defined as a distance between the moving end 112*d'* and the reference point 114*d'*, of the fixed end 114*d'*. In this embodiment, the fixed distance df is less than the moving distance dm, and the spring length ds is greater than the moving distance dm. By the arrangement of the folded spring shown in FIG. 11C, the spring lengths ds are varied according to the rotation of the rotary element 100*d*. The movement principle applied by the micro-electromechanical apparatus 10d' in this embodiment is the above-mentioned second type movement principle shown in FIG. 4.

In this embodiment, each folded spring 110d' comprises a plurality of spans 1100d', 1101d', 1102d' and 1103d' that are connected in sequence. The direction of extension (i.e., Y-axis direction in FIG. 11C) of the spans 1100d', 1101d', 1102d' and 1103d' is parallel to the axis L. In addition, the width Wr of the suspension 120d' is greater than the width Ws of each of the spans 1100d', 1101d', 1102d' and 1103d'. In this embodiment, the lengths (the dimensions along the Y-axis direction) of the spans 1101d', 1102d' and 1103d' are different from each other. The lengths of the spans 1101d', 1102d' and 1103d' are increased along a direction approaching the suspension 120d'. The length of the span 1101d' is less than that of the span 1102d', and the length of the span 1102d' is less than that of the span 1103d'. However, the disclosure is not limited to the feature that the lengths of the spans are different from each other, In other embodiments, for example, the lengths of at least two of the spans 1101d', 1102d' and 1103d' are identical.

In this embodiment, the shape of the frame 130d is square, but the disclosure is not limited thereto. Each suspension 120d' is connected to the inner side of the frame 130d, such that the frame 130d surrounds the suspensions 120d', the folded springs 110d and the rotary element 100d. In addition, in this embodiment, one end of the suspension 120d' is connected to the frame 130d, and the other end of the suspension 120d' is connected to the rotary element 100d by the fixed end 114d of the folded spring 110d.

Figure 11E:
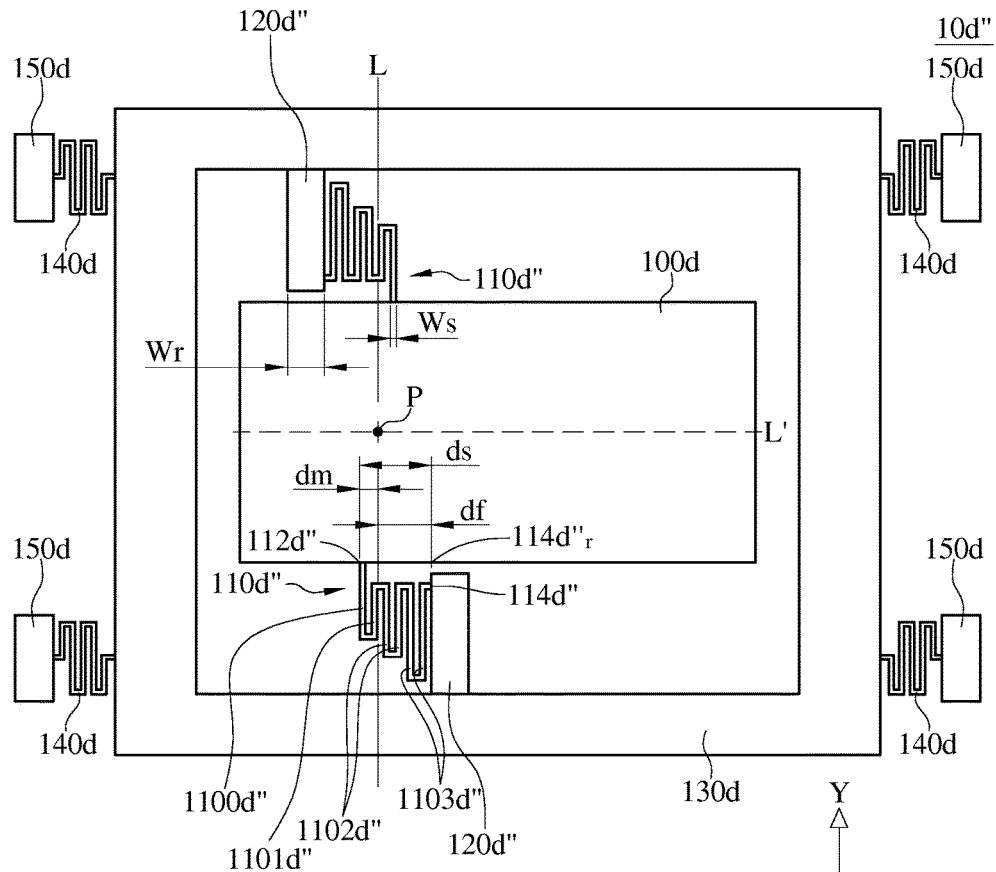
FIG. 11E is a top view of a micro-electromechanical apparatus according to an embodiment of the disclosure.
Figure 11F:
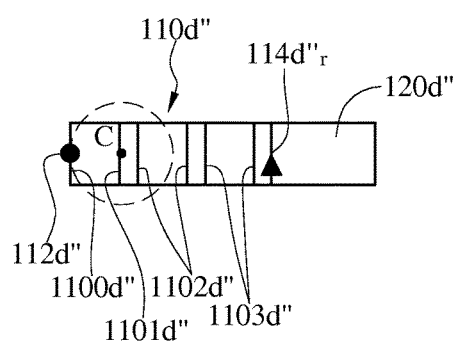
FIG. 11F is a side view of a folded spring and a restraint of a micro-electromechanical apparatus according to an embodiment of the disclosure.

Please refer to FIGS. 11E and 11F, FIG. 11E is a top view of a micro-electromechanical apparatus according to an embodiment of the disclosure, and FIG. 11F is a side view of a folded spring and a restraint of a micro-electromechanical apparatus according to an embodiment of the disclosure. In this disclosure, a micro-electromechanical apparatus 10d" is used in, for example, a Y-axis gyroscope for sensing an angular velocity along the Y axis. The micro-electromechanical apparatus 10d" comprises a mass (i.e., a rotary element 100d in this embodiment), at least one restraint (i.e., a suspension 120d" in this embodiment), a plurality of folded springs 110d", an oscillation element (i.e., a frame 130d in this embodiment), a plurality of springs 140d and a plurality of anchors 150d.

The rotary element 100d is capable of rotating about an axis L. The number of the suspensions 120d" is two, and the two suspensions 120d" are disposed at two opposite sides of the rotary elements 100d.

In this embodiment, the number of the folded springs 110d" is two, which is exemplary. The two folded springs 110d" are symmetrically disposed about a middle point P which is an intersection of the axis L and a central line L' of rotary element as shown in FIG. 11E. In this embodiment, the two folded springs 110d" are in a point-symmetry arrangement about the middle point P. Each folded spring 110d" has a moving end 112d" and a fixed end 114d". The moving end 112d" is connected to the rotary element 100d, the fixed end 114d" is connected to the suspension 120d", and the suspensions 120d" are connected to the rotary elements 100d by the fixed ends 114d" of the folded spring 110d", respectively. In other words, the suspension 120d" (i.e., restraint) in this embodiment is connected to the rotary element 100d via the folded spring 110d". Neither the moving end 112d" nor the fixed end 114d" is located on the axis L.

As shown in FIG. 11E, since the moving ends 112d" and the fixed ends 114d" are not located on the axis L, a moving distance dm is defined as a distance between the moving end 112d" and the axis L, a fixed distance df is a distance between the fixed end 114d" and the axis L, and a spring length ds is defined as a distance between the moving end 112d" and the reference point 114d"', of the fixed end 114d". In this embodiment, the fixed distance df is greater than the moving distance dm, and the spring length ds is greater than the fixed distance df. By the arrangement of the folded springs shown in FIG. 11E, the spring length is varied according to the rotation of the rotary element 100d. The movement principle applied by the micro-electromechanical apparatus 10d" in this embodiment is the above-mentioned fifth type movement principle shown in FIG. 7.

In this embodiment, each folded spring 110d" comprises a plurality of spans 1100d"', 1101d"', 1102d"' and 1103d"' that are connected in sequence. The direction of extension of the spans 1100d"', 1101d"', 1102d"' and 1103d"' is parallel to the axis L. The width Wr of the suspension 120d" is greater than the width Ws of each of the spans 1100d"', 1101d"', 1102d"' and 1103d"'. The lengths of the spans 1101d"', 1102d"', 1103d"' (the dimensions along the Y-axis direction) are different from each other. The lengths of the spans 1101d"', 1102d"', 1103d"' are increased along a direction approaching the suspension 120d"'. The length of the span 1101d"' is less than that of the span 1102d"', and the length of the span 1102d"' is less than that of the span 1103d"' as well. However, the disclosure is not limited to the feature that the lengths of the spans are different from each other. For example, in an embodiment, the lengths of at least two of the spans 1101d"', 1102d"', 1103d"' are identical.

In this embodiment, the shape of the frame 130d is square, but the disclosure is not limited thereto. Each suspension 120d"' is connected to the inner side of the frame 130d, such that the frame 130c surrounds the suspensions 120d"', the folded springs 110d"' and the rotary element 100d. In this embodiment, one end of the suspension 120d"' is connected to the frame 130d, and the other end of the suspension 120d"' is connected to the rotary element 100d by the fixed end 114d"' of the folded spring 110d"'. The frame 130d is connected to the four anchors 150d via the four springs 140d.

According to the micro-electromechanical apparatuses described in the above-mentioned embodiments, the rotary element rotates by the stretch-type deformation of the folded spring instead of torsion-type deformation of a torsion beam. Thus, the stiffness of the folded springs connected to the rotary element and the stiffness of the frame are directly proportional to the width of the spring. It means that the resonant frequency of the frame is close to that of the rotary element when the spring width is varied during manufacturing.

According to the micro-electromechanical apparatuses described in the above-mentioned embodiments, the restraint is connected to the rotary element via the folded spring. One end of the folded spring is connected to the rotary element, and the other end of the folded spring is connected to the restraint such as suspension, anchor and frame. In this disclosure, the element (e.g., the suspension, anchor, frame etc.) can be defined as a restraint if the element is connected by one end of the folded spring of which the other end is connected to the rotary element.

According to the micro-electromechanical apparatus provided in the disclosure, the folded spring is connected to the rotary element such that the rotary element is capable of rotating about an axis. Therefore, the micro-electromechanical apparatus in the disclosure can be modified in accordance with different purposes. The micro-electromechanical apparatus may be adapted to various types of micro-electromechanical apparatus, such as accelerometer, gyroscope, micro-mirror and magnetometer. When the micro-electromechanical apparatus is to be miniaturized, only the number of the spans of the folded spring connected to the rotary element needs to be changed to keep the rotary element rotate at specific frequencies. In other words, the lengths of the spans of the folded spring do not need to be increased to keep the rotary element oscillate at the specific frequencies.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

What is claimed is:

1. A micro-electromechanical apparatus, comprising:
a rotary element, being capable of rotating with respect to an axis;
at least one restraint; and
at least two folded springs disposed symmetrically about the axis, wherein each of the at least two folded spring has a moving end and a fixed end, the moving end is connected to the rotary element and the fixed end is connected to the at least one restraint, the moving end is not located on the axis and the fixed end is not located on the axis, each of the at least two folded springs includes a plurality of spans which are connected in sequence;
wherein a moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element;
wherein the restraint is divided into a first part and a second part by a plane having a normal direction parallel to the axis, a central point of the fixed end is on the plane, and the first part and the second part are both stationary relative to the axis;
wherein the fixed distance is greater than half of each width of each of the plurality of spans;
wherein a distance from the fixed end to the rotary element along a direction parallel to the axis is smaller than a length of at least one of the plurality of spans.

2. The micro-electromechanical apparatus according to claim 1, wherein the fixed distance is less than or equal to the moving distance and the spring length is less than or equal to the moving distance.

3. The micro-electromechanical apparatus according to claim 1, wherein a direction of a extension of the plurality of the spans is parallel to direction of the axis, the at least one restraint is at least one suspension, and a width of the at least one suspension is greater than a width of at least one of the plurality of the spans.

4. The micro-electromechanical apparatus according to claim 3, wherein lengths of at least two of the plurality of the spans are different from each other.

5. The micro-electromechanical apparatus according to claim 4, wherein lengths of all of the plurality of the spans are different from each other, and the lengths of the plurality of the spans are decreased along a direction farther away from the axis.

6. The micro-electromechanical apparatus according to claim 4, wherein lengths of all of the plurality of the spans are different from each other, and the lengths of the plurality of the spans are increased along a direction farther away from the axis.

7. The micro-electromechanical apparatus according to claim 3, wherein lengths of at least two of the plurality of the spans are identical.

8. The micro-electromechanical apparatus according to claim 1, wherein the at least one restraint is a frame.

9. The micro-electromechanical apparatus according to claim 1, wherein the at least one restraint is an anchor.

10. The micro-electromechanical apparatus according to claim 3, further comprising a frame, wherein the rotary element is located inside the frame, and the at least one suspension is connected to the frame.

11. The micro-electromechanical apparatus according to claim 10, wherein the at least one suspension further has a first end and a second end, the first end and the second end are connected to the frame, and the first end and the second end are disposed symmetrically about the axis.

12. The micro-electromechanical apparatus according to claim 1, wherein the fixed distance is less than or equal to the moving distance and the spring length is greater than the moving distance.

13. The micro-electromechanical apparatus according to claim 12, wherein each of the folded springs includes a plurality of spans that are connected in sequence, direction of extension of the plurality of the spans is parallel to direction of the axis, the at least one restraint is at least one suspension, and a width of the at least one suspension is greater than a width of at least one of the plurality of the spans.

14. The micro-electromechanical apparatus according to claim 13, wherein lengths of at least two of the plurality of the spans are different from each other.

15. The micro-electromechanical apparatus according to claim 1, wherein the fixed distance is greater than the moving distance and the spring length is less than or equal to the fixed distance.

16. The micro-electromechanical apparatus according to claim 15, wherein each of the at least two folded springs includes a plurality of spans that are connected in sequence, direction of extension of the plurality of the spans is parallel to direction of the axis, the at least one restraint is at least one suspension, and a width of the at least one suspension is greater than a width of at least one of the plurality of the spans.

17. The micro-electromechanical apparatus according to claim 16, wherein lengths of at least two of the plurality of the spans are different from each other.

18. The micro-electromechanical apparatus according to claim 1, wherein the fixed distance is greater than the moving distance, and the spring length is greater than the fixed distance.

19. The micro-electromechanical apparatus according to claim 18, wherein each of the folded springs includes a plurality of spans that are connected in sequence, direction of extension of the plurality of the spans is parallel to direction of the axis, the at least one restraint is at least one suspension, and a width of the at least one suspension is greater than a width of at least one of the plurality of the spans.

20. The micro-electromechanical apparatus according to claim 19, wherein lengths of at least two of the plurality of the spans are different from each other.

21. A micro-electromechanical apparatus, comprising:
a rotary element, being capable of rotating with respect to an axis;

at least one restraint; and at least two folded springs disposed symmetrically about the axis, wherein each of the at least two folded spring has a moving end and a fixed end, the moving end is connected to the rotary element, the fixed end is connected to the at least one restraint, the moving end is not located on the axis and the fixed end is not located on the axis;

wherein a moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element;

wherein each of the at least two folded springs includes a plurality of spans which are connected in sequence, direction of extension of the plurality of the spans is parallel to direction of the axis, the at least one restraint is at least one suspension, and a width of the at least one suspension is greater than a width of at least one of the plurality of the spans;

wherein the restraint is divided into a first part and a second part by a plane having a normal direction parallel to the axis, a central point of the fixed end is on the plane, and the first part and the second part are both stationary relative to the axis;

wherein the fixed distance is greater than half of each width of each of the plurality of spans;

wherein a distance from the fixed end to the rotary element along a direction parallel to the axis is smaller than a length of at least one of the plurality of spans.

22. The micro-electromechanical apparatus according to claim 21, wherein lengths of at least two of the plurality of the spans are different from each other.

23. The micro-electromechanical apparatus according to claim 22, wherein lengths of all of the plurality of the spans are different from each other, and the lengths of the plurality of the spans are decreased along a direction farther away from the axis.

24. The micro-electromechanical apparatus according to claim 22, wherein lengths of all of the plurality of the spans are different from each other, and the lengths of the plurality of the spans are increased along a direction farther away from the axis.

25. A micro-electromechanical apparatus, comprising:
a rotary element, being capable of rotating with respect to an axis;
at least one restraint; and
at least two folded springs disposed symmetrically about the axis, wherein each of the at least two folded spring has a moving end and a fixed end, the moving end is connected to the rotary element, and the fixed end is connected to the at least one restraint; wherein the moving end is not located on the axis and the fixed end is not located on the axis;

wherein a moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element;

wherein each of the folded springs includes a plurality of spans which are connected in sequence, direction of extension of the plurality of the spans is parallel to direction of the axis, and lengths of at least two of the plurality of the spans are different from each other.

26. The micro-electromechanical apparatus according to claim 25, wherein the fixed distance is less than or equal to the moving distance, and the spring length is less than or equal to the moving distance.

27. The micro-electromechanical apparatus according to claim 25, wherein the fixed distance is less than or equal to the moving distance, and the spring length is greater than the moving distance.

28. The micro-electromechanical apparatus according to claim 25, wherein the fixed distance is greater than the moving distance, and the spring length is less than or equal to the fixed distance.

29. The micro-electromechanical apparatus according to claim 25, wherein the fixed distance is greater than the moving distance, and the spring length is greater than the fixed distance.

30. A micro-electromechanical apparatus, being adapted to detect angular velocity, comprising:
a mass, being capable of rotating with respect to an axis;
a frame, being capable of oscillation;
at least one restraint, connected to the frame; and
at least two folded springs disposed symmetrically with respect to the axis, wherein each of the at least two folded spring has a moving end and a fixed end, the moving end is connected to the mass, and the fixed end is connected to the at least one restraint, the moving end is not located on the axis and the fixed end is not located on the axis, each of the at least two folded springs includes a plurality of spans which are connected in sequence;

wherein a moving distance is defined as a distance between the moving end and the axis, a fixed distance is defined as a distance between the fixed end and the axis, a spring length is defined as a distance between the moving end and a reference point of the fixed end, and the spring length is varied according to rotation of the mass;

wherein the fixed distance is less than or equal to the moving distance, and wherein the spring length is less than or equal to the moving distance;

wherein the restraint is divided into a first part and a second part by a plane having a normal direction parallel to the axis, a central point of the fixed end is on the plane, and the first part and the second part are both stationary relative to the axis;

wherein the fixed distance is greater than half of each width of each of the plurality of spans;

wherein a distance from the fixed end to the mass along a direction parallel to the axis is smaller than a length of at least one of the plurality of spans.

31. The micro-electromechanical apparatus according to claim 30, wherein direction of extension of the plurality of the spans is parallel to direction of the axis, the at least one restraint is at least one suspension, and a width of the at least one suspension is greater than a width of at least one of the plurality of the spans.

32. The micro-electromechanical apparatus according to claim 31, wherein lengths of at least two of the plurality of the spans are different from each other.

33. The micro-electromechanical apparatus according to claim 32, wherein lengths of all of the plurality of the spans are different from each other, and the lengths of the plurality of the spans are decreased along a direction farther away from the axis.

34. The micro-electromechanical apparatus according to claim 31, wherein a mass is located inside the frame.

35. The micro-electromechanical apparatus according to claim 34, wherein the at least one suspension further has a first end and a second end, the first end and the second end are connected to the frame, and the first end and the second end are disposed symmetrically about the axis.

36. A micro-electromechanical apparatus, comprising:
a rotary element, being capable of rotating with respect to an axis;
at least one restraint; and
at least two folded springs disposed symmetrically about the axis, wherein each of the at least two folded spring has a moving end and a fixed end, the moving end is connected to the rotary element and the fixed end is connected to the at least one restraint, the moving end is not located on the axis and the fixed end is not located on the axis;
wherein a moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element;
wherein the fixed distance is less than or equal to the moving distance and the spring length is less than or equal to the moving distance;
wherein each of the at least two folded springs includes a plurality of spans which are connected in sequence, a direction of a extension of the plurality of the spans is parallel to direction of the axis, the at least one restraint is at least one suspension, and a width of the at least one suspension is greater than a width of at least one of the plurality of the spans;
wherein lengths of all of the plurality of the spans are different from each other, and the lengths of the plurality of the spans are decreased along a direction farther away from the axis.

37. A micro-electromechanical apparatus, comprising:
a rotary element, being capable of rotating with respect to an axis;
at least one restraint; and
at least two folded springs disposed symmetrically about the axis, wherein each of the at least two folded spring has a moving end and a fixed end, the moving end is connected to the rotary element and the fixed end is connected to the at least one restraint, the moving end is not located on the axis and the fixed end is not located on the axis;
wherein a moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element;
wherein the fixed distance is less than or equal to the moving distance and the spring length is greater than the moving distance;
wherein each of the folded springs includes a plurality of spans that are connected in sequence, direction of extension of the plurality of the spans is parallel to direction of the axis, the at least one restraint is at least one suspension, and a width of the at least one suspension is greater than a width of at least one of the plurality of the spans;
wherein lengths of at least two of the plurality of the spans are different from each other.

38. A micro-electromechanical apparatus, comprising:
a rotary element, being capable of rotating with respect to an axis;
at least one restraint; and
at least two folded springs disposed symmetrically about the axis, wherein each of the at least two folded spring has a moving end and a fixed end, the moving end is connected to the rotary element and the fixed end is connected to the at least one restraint, the moving end is not located on the axis and the fixed end is not located on the axis;
wherein a moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element;
wherein the fixed distance is greater than the moving distance and the spring length is less than or equal to the fixed distance;
wherein each of the at least two folded springs includes a plurality of spans that are connected in sequence, direction of extension of the plurality of the spans is parallel to direction of the axis, the at least one restraint is at least one suspension, and a width of the at least one suspension is greater than a width of at least one of the plurality of the spans;
wherein lengths of at least two of the plurality of the spans are different from each other.

39. A micro-electromechanical apparatus, comprising:
a rotary element, being capable of rotating with respect to an axis;
at least one restraint; and
at least two folded springs disposed symmetrically about the axis, wherein each of the at least two folded spring has a moving end and a fixed end, the moving end is connected to the rotary element and the fixed end is connected to the at least one restraint, the moving end is not located on the axis and the fixed end is not located on the axis;
wherein a moving distance is defined as a distance between the moving end and the axis, a fixed distance is defined as a distance between the fixed end and the axis, a spring length is defined as a distance between the moving end and a reference point of the fixed end, and the spring length is varied according to rotation of the rotary element;
wherein the fixed distance is greater than the moving distance, and the spring length is greater than the fixed distance;
wherein each of the folded springs includes a plurality of spans that are connected in sequence, direction of extension of the plurality of the spans is parallel to direction of the axis, the at least one restraint is at least one suspension, and a width of the at least one suspension is greater than a width of at least one of the plurality of the spans;
wherein lengths of at least two of the plurality of the spans are different from each other.

* * * * *